United States Patent
Yamamoto et al.

(10) Patent No.: US 9,564,214 B2
(45) Date of Patent: Feb. 7, 2017

(54) MEMORY DEVICE

(71) Applicant: Kabushiki Kaisha Toshiba, Minato-ku (JP)

(72) Inventors: Kazuhiko Yamamoto, Yokkaichi (JP); Kunifumi Suzuki, Yokkaichi (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/817,392

(22) Filed: Aug. 4, 2015

(65) Prior Publication Data

US 2016/0267967 A1    Sep. 15, 2016

Related U.S. Application Data

(60) Provisional application No. 62/132,728, filed on Mar. 13, 2015.

(51) Int. Cl.
  *G11C 13/00* (2006.01)
  *H01L 45/00* (2006.01)
  *H01L 27/24* (2006.01)

(52) U.S. Cl.
  CPC ......... *G11C 13/0004* (2013.01); *G11C 13/004* (2013.01); *G11C 13/0069* (2013.01);
  (Continued)

(58) Field of Classification Search
  None
  See application file for complete search history.

(56) References Cited

U.S. PATENT DOCUMENTS 8,565,004 B2    10/2013  Iijima et al.
2006/0113520 A1*  6/2006  Yamamoto ............. H01L 45/06
                                                           257/3
(Continued)

FOREIGN PATENT DOCUMENTS

JP    2010-177387    8/2010
JP    5645778        12/2014
(Continued)

OTHER PUBLICATIONS

R.E. Simpson et al. "Interfacial Phase-Change Memory", Nature Nanotechnology, Jul. 3, 2011, 5 pages.
(Continued)

*Primary Examiner* — James G Norman
(74) *Attorney, Agent, or Firm* — Oblon, McClelland, Maier & Neustadt, L.L.P.

(57) ABSTRACT

According to one embodiment, a memory device includes a controller; a first electrode and a second electrode connected to the controller; and a variable resistance layer provided between the first electrode and the second electrode. The variable resistance layer has a first structure, and a second structure. The controller configured to be able to perform a first operation of applying a first voltage between the first electrode and the second electrode, a second operation of applying a second voltage between the first electrode and the second electrode and determining whether or not the variable resistance layer has the second structure, and a third operation of applying a third voltage between the first electrode and the second electrode having the interposed variable resistance layer determined to not have the second structure in the second operation.

16 Claims, 19 Drawing Sheets

(52) U.S. Cl.
CPC ...... *G11C 13/0097* (2013.01); *H01L 27/2463* (2013.01); *H01L 45/06* (2013.01); *H01L 45/1233* (2013.01); *H01L 45/1253* (2013.01); *H01L 45/141* (2013.01); *G11C 2013/005* (2013.01); *G11C 2013/009* (2013.01)

(56) References Cited

U.S. PATENT DOCUMENTS

| | | | | |
|---|---|---|---|---|
| 2006/0268594 | A1* | 11/2006 | Toda | G11C 13/0011 365/100 |
| 2011/0103139 | A1* | 5/2011 | Kau | G11C 13/0004 365/163 |
| 2011/0315942 | A1 | 12/2011 | Tominaga et al. | |

FOREIGN PATENT DOCUMENTS

| | | |
|---|---|---|
| TW | 200836195 A | 9/2008 |
| TW | 201103180 A | 1/2011 |
| TW | 201110438 A | 3/2011 |
| TW | M480148 U | 6/2014 |
| TW | I458147 | 10/2014 |

OTHER PUBLICATIONS

Taiwan Office Action issued Aug. 1, 2016 in Taiwanese Patent Application No. 104129072 (with English translation), 14 pages.

\* cited by examiner

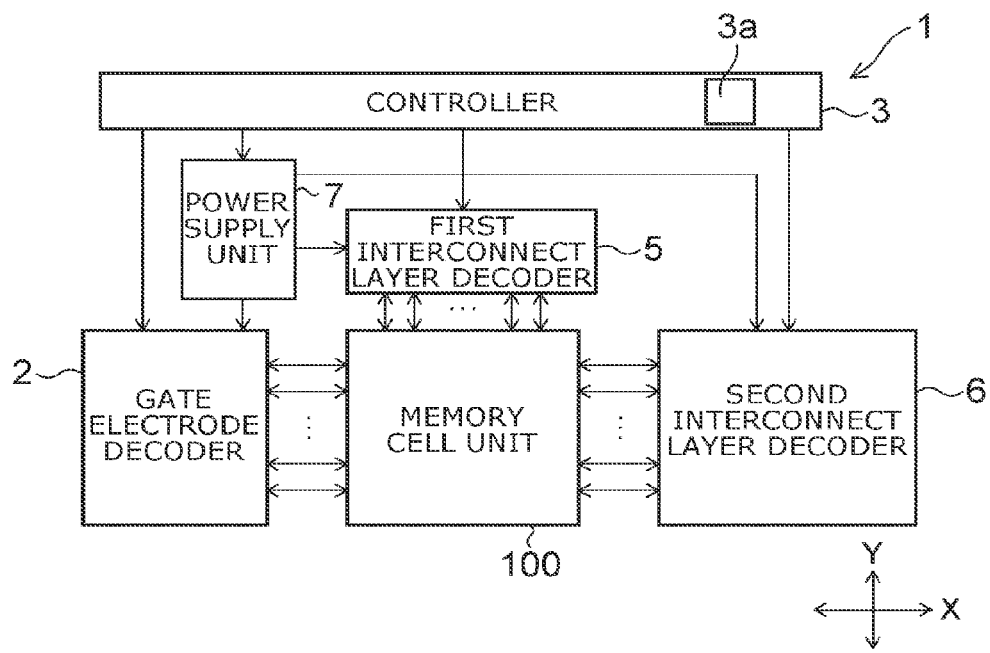
FIG. 1A
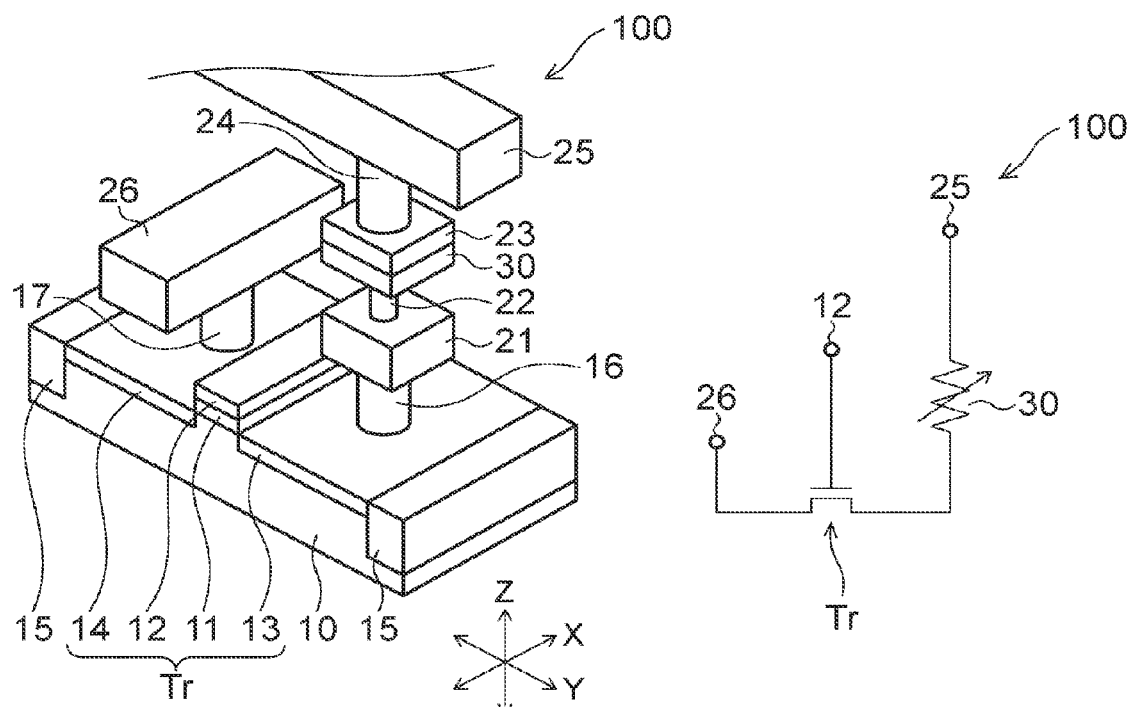
FIG. 1B
FIG. 1C

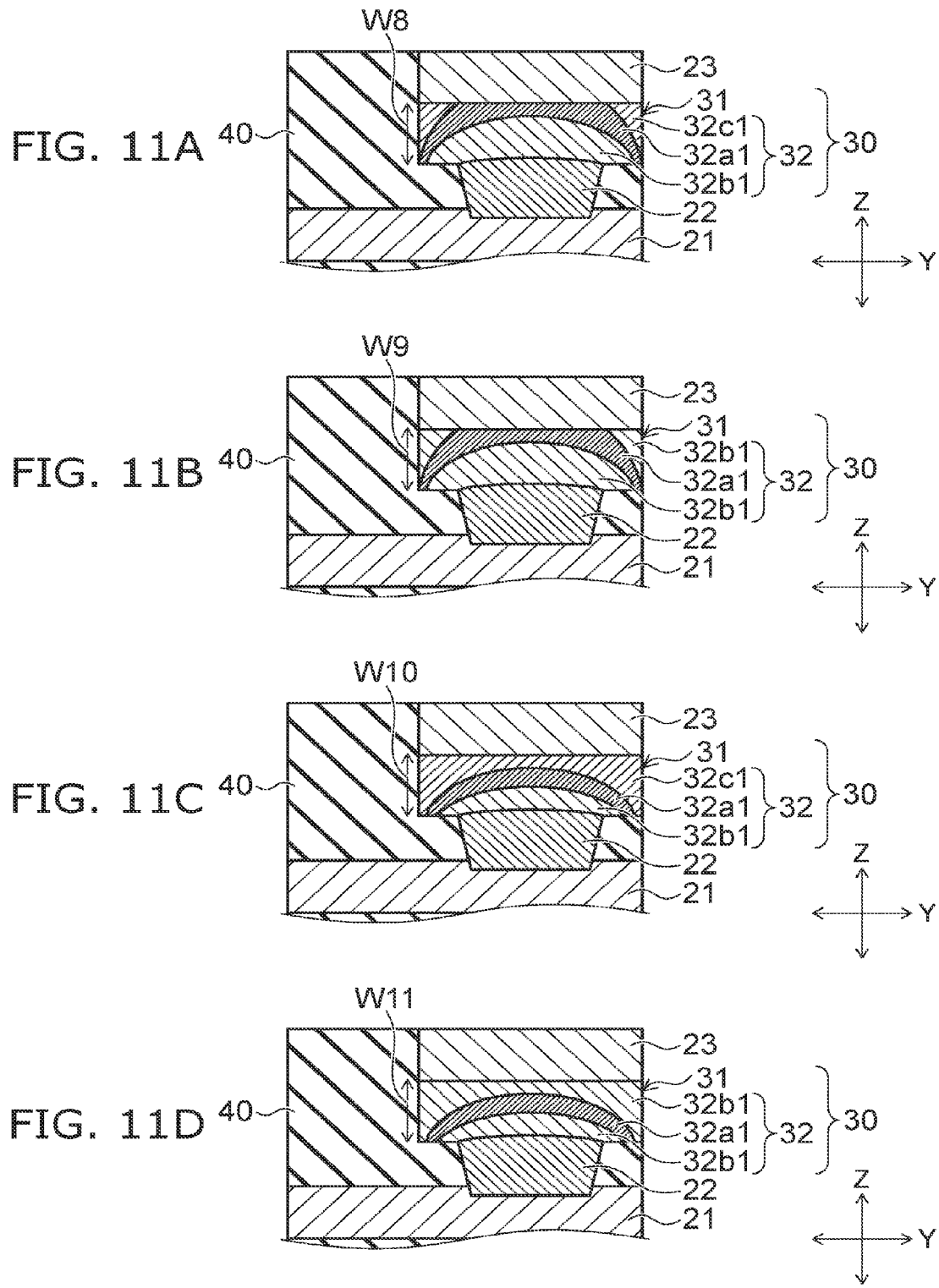

MEMORY DEVICE

This application is based upon and claims the benefit of priority from U.S. Provisional Patent Application 62/132,728 field on Mar. 13, 2015; the entire contents of which are incorporated herein by reference.

FIELD

Embodiments described herein relate generally to a memory device.

BACKGROUND

Generally, in a resistance random access memory device, electrodes are formed to have a variable resistance unit interposed. Information is stored by changing the resistance state of the variable resistance unit by supplying a current to the variable resistance unit. There are expectations for increasing the number of resistance changes (the Endurance number) of the resistance random access memory device recited above.

BRIEF DESCRIPTION OF THE DRAWINGS

FIG. 1A is a circuit diagram of a memory device of a first embodiment, FIG. 1B is a schematic perspective view of a memory cell unit of the first embodiment, and FIG. 1C is a circuit diagram of the memory cell unit of the first embodiment;

FIGS. 11A to 11D are schematic cross-sectional views of a variable resistance layer of the first embodiment;

DETAILED DESCRIPTION

Figure 2A:
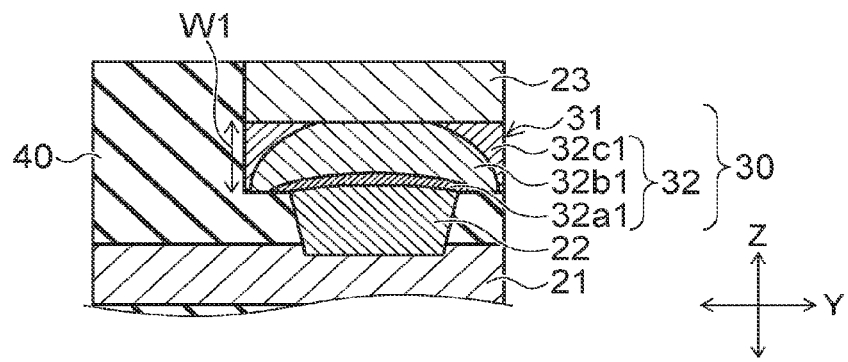
FIGS. 2A to 2D are schematic cross-sectional views of a variable resistance layer of the first embodiment.

According to one embodiment, a memory device includes a controller; a first electrode and a second electrode connected to the controller; and a variable resistance layer provided between the first electrode and the second electrode, the variable resistance layer including a chalcogenide compound. The variable resistance layer has a first structure, and a second structure, a structure of the grain boundary of the second structure being different from a crystal structure of the first structure. The controller configured to be able to perform a first operation of applying a first voltage between the first electrode and the second electrode, a second operation of applying a second voltage between the first electrode and the second electrode and determining whether or not the variable resistance layer has the second structure, the second voltage being lower than the first voltage, and a third operation of applying a third voltage between the first electrode and the second electrode having the interposed variable resistance layer determined to not have the second structure in the second operation, the third voltage being higher than the first voltage and the second voltage.

First Embodiment

FIG. 1A is a circuit diagram of a memory device 1 of the embodiment; and FIG. 1B is a schematic perspective view of a memory cell unit 100 of the embodiment. In FIG. 1B, the insulating layers of the periphery, etc., are not shown for easier viewing of the drawing.

FIG. 1C is a circuit diagram of the memory cell unit 100 of the embodiment.

In FIG. 1A to FIG. 1C, two mutually-orthogonal directions are taken as an X-direction and a Y-direction; and a direction in which the device is stacked that intersects the X-direction and the Y-direction (the XY plane) is taken as a Z-direction.

As shown in FIG. 1A and FIG. 1B, the memory device 1 of the embodiment includes the memory cell unit 100, a controller 3, a gate electrode decoder 2, a first interconnect layer decoder 5, a second interconnect layer decoder 6, and a power supply unit 7. The memory cell unit 100 includes a variable resistance layer 30 (a variable resistance unit) and a transistor Tr.

The controller 3 controls the operations of the memory device 1. The controller 3 performs the control of a set operation, a reset operation, a read-out operation, etc., of the memory cell unit 100 via the gate electrode decoder 2, the first interconnect layer decoder 5, and the second interconnect layer decoder 6.

The power supply unit 7 supplies a voltage to each unit based on a signal from the controller 3. For example, the power supply unit 7 supplies the voltage to the gate electrode decoder 2, the first interconnect layer decoder 5, and the second interconnect layer decoder 6. The set operation, the reset operation, the read-out operation, etc., of the memory cell unit 100 are executed using the voltage.

The gate electrode decoder 2 is electrically connected to a gate electrode 12 of the memory cell unit 100. The first interconnect layer decoder 5 is electrically connected to a first interconnect layer 25 of the memory cell unit 100. The second interconnect layer decoder 6 is electrically connected to a second interconnect layer 26 of the memory cell unit 100. The decoders 2, 5, and 6 apply prescribed voltages to the gate electrode 12, the first interconnect layer 25, and the second interconnect layer 26 corresponding to the selected variable resistance layer 30 and transistor Tr of the multiple variable resistance layers 30 and the multiple transistors Tr. Thereby, the reprogramming and reading of the information stored in the selected variable resistance layer 30 can be performed. The controller 3 includes a register 3a. The register 3a, for example, counts the set operation cycle, the reset operation cycle, etc., and records each of number of times.

As shown in FIG. 1B, a substrate 10 is provided in the memory cell unit 100 of the embodiment. A gate insulator film 11 is provided on the substrate 10. The gate electrode (the word line) 12 is provided on the gate insulator film 11.

Source/drain regions 13 and 14 are provided in the upper portion of the substrate 10 with the region directly under the gate insulator film 11 interposed between the source/drain regions 13 and 14.

The gate insulator film 11, the gate electrode 12, and the source/drain regions 13 and 14 are included in the transistor Tr. The region between the source/drain regions 13 and 14 of the substrate 10 functions as a channel of the transistor Tr.

An isolation area 15 is provided around the transistor Tr. The isolation area 15 contacts the source/drain regions 13 and 14. An electrode layer 21 is provided on the source/drain region 13 with a contact 16 interposed. A first electrode 22 is provided on the electrode layer 21. The variable resistance layer 30 is provided on the first electrode 22. A second electrode 23 is provided on the variable resistance layer 30. The first interconnect layer 25 (the bit line) extends in the Y-direction and is provided on the second electrode 23 with a contact 24 interposed. In other words, the first interconnect layer 25 is electrically connected to the source/drain region 13 via the variable resistance layer 30.

The second interconnect layer 26 is provided on the source/drain region 14 with a contact 17 interposed. In other words, the second interconnect layer 26 is electrically connected to the source/drain region 14.

As described below, the state (the concentration distribution of a chemical element 35 described below) inside the variable resistance layer 30 changes due to the effects of heat and at least one of an electric field or stress applied to the variable resistance layer 30. Thereby, the resistance value of the variable resistance layer 30 changes; and data can be stored. That is, for example, the variable resistance layer 30 can store the data by using the low resistance state of the variable resistance layer 30 as "1" and using the high resistance state as "0." That is, it is possible to use the variable resistance layer 30 as memory.

The second interconnect layer 26 (the source layer) is provided on the source/drain region 14 with the contact 17 interposed. The second interconnect layer 26 extends in the X-direction. The second interconnect layer 26 is electrically connected to the transistor Tr.

Using the configuration recited above in the memory cell unit 100 of the embodiment as shown in FIG. 1C, one variable resistance layer 30 and one transistor Tr are provided by being connected in series between the first interconnect layer 25 and the second interconnect layer 26 (a 1T1R structure).

(Basic Configuration of Variable Resistance Layer 30)

The basic configuration, states, and structures of the variable resistance layer 30 will now be described using FIG. 2 to FIG. 3D. The operation method for changing the resistance of the variable resistance layer 30 is described below.

The basic configuration of the variable resistance layer 30 will now be described with reference to FIG. 2A.

FIG. 2A is a schematic cross-sectional view of the variable resistance layer 30 of the embodiment. In FIG. 2A, the structures under the electrode layer 21 and on the second electrode 23 are not shown.

As shown in FIG. 2A, the variable resistance layer 30 includes a chalcogenide compound 31. Also, the variable resistance layer 30 includes the chemical element 35. For example, the chemical element 35 may be included inside the crystal structure of the chalcogenide compound 31 or may be precipitated inside the variable resistance layer 30. A thickness W1 in the Z-direction of the variable resistance layer 30 is, for example, 50 nm or less.

The chalcogenide compound 31 is provided on the first electrode 22. The chalcogenide compound 31 has a crystal structure and has the c-axis orientation. In the embodiment, the "c-axis" is, for example, the Z-direction. Both a first state F1 and a second state F2 of the variable resistance layer 30 described below have crystal structures and have the c-axis orientation.

For example, the chalcogenide compound 31 includes a compound of at least one type of chemical element selected from a first group and a second group described below and at least one type of chemical element selected from a third group described below. In the embodiment, the chalcogenide compound 31 is, for example, $Sb_2Te_3$ which is a compound of antimony and tellurium. The electrical resistivity of the chalcogenide compound 31 is, for example, 1000 glom or less.

The first group includes, for example, each of germanium, silicon, and carbon. For example, the second group includes each of titanium, vanadium, copper, zinc, chrome, zirconium, platinum, palladium, molybdenum, nickel, manganese, hafnium, bismuth, and antimony. The third group includes, for example, each of sulfur, selenium, and tellurium.

The chemical element 35 includes, for example, at least one of germanium, silicon, or carbon. In the embodiment, the chemical element 35 is germanium.

The first electrode 22 and the second electrode 23 include, for example, a material having a low diffusion coefficient of the chemical element 35, e.g., titanium nitride.

For example, the variable resistance layer 30 may not include the chemical element 35 and may have a structure (e.g., a superlattice structure) in which chalcogenide compounds of different materials are multiply stacked. In such a case, the resistance of the variable resistance layer 30 is changed by changing the crystal structure of the superlattice structure. The variable resistance layer 30 includes a variable resistance element in which the resistance can be changed without a phase transition (melting) of the material.

(States of Variable Resistance Layer 30)

An example of the states of the variable resistance layer 30 will now be described with reference to FIG. 2A and FIG. 2B. Here, an example of the variable resistance layer 30 is described in which the potential of the first electrode 22 is lower than the potential of the second electrode 23. Descriptions of other examples of the variable resistance layer 30 and descriptions of the variable resistance layer 30 when the potential of the first electrode 22 is higher than the potential of the second electrode 23 are recited below.

Figure 2B:
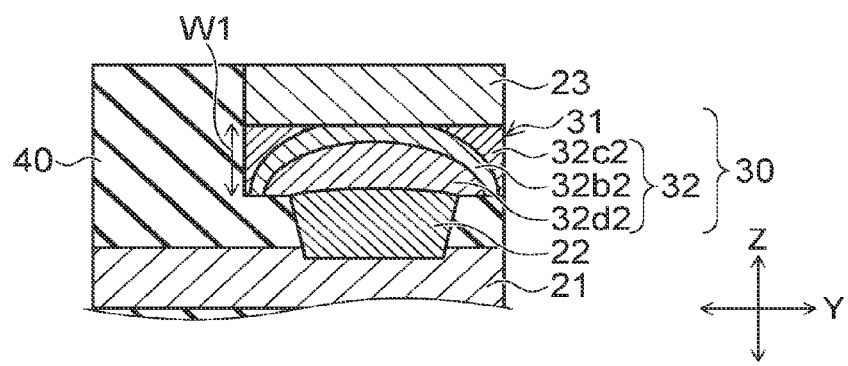

The variable resistance layer 30 has the first state F1 shown in FIG. 2A and the second state F2 shown in FIG. 2B. The first state F1 substantially corresponds to the high resistance state in which the electrical resistance is high. The second state F2 substantially corresponds to the low resistance state in which the electrical resistance is low. The first state F1 and the second state F2 are electrically switchable. As described above, by using each of the states as data of "0" or "1," the variable resistance layer 30 nonvolatilely stores the data. The states of the variable resistance layer 30 are formed respectively by a set operation S110 or a reset operation S150 described below.

The first state F1 shown in FIG. 2A will now be described.

As shown in FIG. 2A, a first region 32a1 that covers the upper surface of the first electrode 22 is provided inside the variable resistance layer 30 in the first state F1. The first region 32a1 contacts the upper surface of the first electrode 22. The first region 32a1 covers the upper surface of the first electrode 22. The upper surface of the first region 32a1 is covered with a second region 32b1. The first region 32a1 contacts the second region 32b1.

The second region 32b1 contacts the lower surface of the second electrode 23. The second region 32b1 contacts a third region 32c1.

The third region 32c1 is provided in a region other than the region where the first region 32a1 and the second region 32b1 are provided. The third region 32c1 contacts the second electrode 23.

The concentration of the chemical element 35 in the first region 32a1 is higher than the concentration in the second region 32b1 and the third region 32c1. The concentration of the chemical element 35 in the third region 32c1 is not less than the concentration in the second region 32b1.

In other words, the concentration of the chemical element 35 for the regions 32a1, 32b1, and 32c1 is expressed using inequality signs in Formula (1).

$$\text{first region } 32a1 > \text{third region } 32c1 \geq \text{second region } 32b1 \quad (1)$$

For example, EDX (Energy dispersive X-ray spectrometry) or the like is used as the method for measuring the concentration of the chemical element 35 inside the variable resistance layer 30. Also, a measurement method may be used that detects the characteristic X-ray that is emitted when an X-ray, radiated light, or the like is irradiated on the variable resistance layer 30.

In the embodiment, the inventors confirmed the concentration difference described above by measuring the concentration of the chemical element 35 (the first region 32a1, the second region 32b1, the third region 32c1, etc.) using EDX. For example, the concentration of the chemical element 35 is expressed by the number per unit volume (atoms/cm^3).

The method for forming the first state F1 is, for example, as follows. A more detailed description is described below as the operation method. For example, the chemical element 35 has a positively charged state or a positive ion state. Therefore, when a voltage is applied between the first electrode 22 and the second electrode 23, the chemical element 35 collects on the side of the electrode having the low voltage. In other words, the first region 32a1, the second region 32b1, and the third region 32c1 are provided by a concentration gradient of the chemical element 35 occurring inside the variable resistance layer 30.

That is, the first region 32a1 is provided on a line inside the variable resistance layer 30 linking the first electrode 22 and the second electrode 23 for the variable resistance layer 30 in the first state F1. In other words, the first region 32a1 is provided in the current path between the first electrode 22 and the second electrode 23. Thereby, the resistance of the variable resistance layer 30 in the first state F1 becomes high.

The second state F2 shown in FIG. 2B will now be described.

As shown in FIG. 2B, a fourth region 32d2 that covers the upper surface of the first electrode 22 is provided inside the variable resistance layer 30 in the second state F2. A second region 32b2 is provided on the upper surface of the fourth region 32d2. The second region 32b2 contacts the lower surface of the second electrode 23. A third region 32c2 is provided in a region other than the region where the fourth region 32d2 and the second region 32b2 are provided.

The concentration of the chemical element 35 in the fourth region 32d2 is higher than the concentration in the second region 32b2 and the third region 32c2 and lower than the concentration in the first region 32a1 in the first state F1. For example, the concentration of the chemical element 35 in the first region 32a1 is not less than 10 times the concentration in the fourth region 32d2. The concentration of the chemical element 35 in the third region 32c2 is not less than the concentration in the second region 32b2.

In other words, the concentration of the chemical element 35 in the regions 32a1, 32d2, 32b2, and 32c2 is expressed using inequality signs in Formula (2).

$$\text{first region } 32a1 > \text{fourth region } 32d2 > \text{third region } 32c2 \geq \text{second region } 32b2 \quad (2)$$

Also, the concentration of the chemical element 35 in the second region 32b2 in the second state F2 is about the same as the concentration in the second region 32b1 in the first state F1. In other words, the concentration gradient between the fourth region 32d2 and the second region 32b2 in the second state F2 is smaller than the concentration gradient between the first region 32a1 and the second region 32b1 in the first state F1. The volume of the fourth region 32d2 in the second state F2 is, for example, not less than the volume of the first region 32a1 in the first state F1.

The method for forming the second state F2 is, for example, as follows. A more detailed description is recited below as the operation method. Similarly to the method for forming the first state F1 described above, the concentration gradient of the chemical element 35 occurs inside the variable resistance layer 30 when the voltage is applied between the first electrode 22 and the second electrode 23. At this time, compared to the first state F1, the chemical element 35 is affected by the Joule heat generated in the first electrode 22. Therefore, the diffusion of the chemical element 35 of the first electrode 22 upper portion is promoted. Thereby, the fourth region 32d2, the second region 32b2, and the third region 32c2 are provided inside the variable resistance layer 30; and the second state F2 is formed.

That is, the first region 32a1 which has high resistance is not provided on a line linking the first electrode 22 and the second electrode 23 inside the variable resistance layer 30. In other words, the first region 32a1 which has the high resistance is not provided in the current path between the first electrode 22 and the second electrode 23. Thereby, the resistance of the variable resistance layer 30 in the second state F2 is lower than the resistance of the variable resistance layer 30 in the first state F1.

The first electrode 22 may be provided on a portion of the lower surface of the variable resistance layer 30; and the second electrode 23 may be provided on substantially the upper surface of the variable resistance layer 30.

(Grain Boundary of Variable Resistance Layer)

An example of the structure of the variable resistance layer 30 will now be described with reference to FIG. 2C to FIG. 3D. There are cases where the variable resistance layer 30 has a first structure C1, a second structure C2, and a third structure C3. The structures C1, C2, and C3 are not exclusive; and the variable resistance layer 30 may include two or more structures simultaneously or may not include any of the structures.

The first structure C1 will now be described with reference to FIG. 2C and FIG. 2D.

Figure 2C:
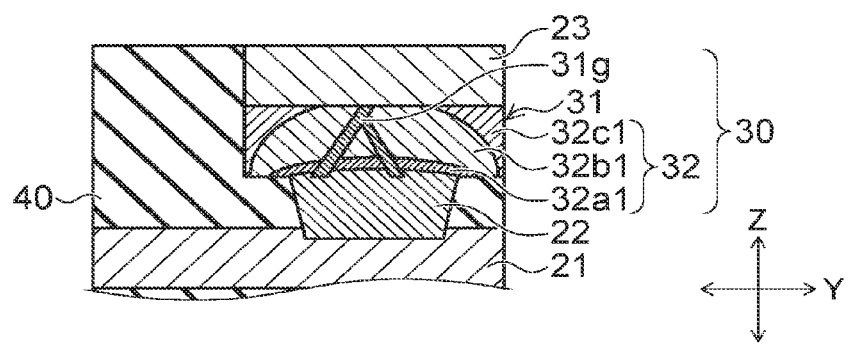
Figure 2D:
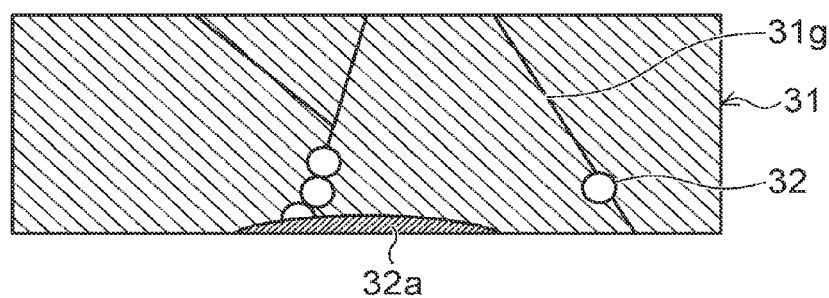

As shown in FIG. 2C and FIG. 2D, the first structure C1 is a structure in which a grain boundary 31g (a crystal grain boundary) is provided to be continuous between the first electrode 22 and the second electrode 23. A region having a high concentration of the chemical element 35 may exist on the grain boundary 31g. In other words, there are cases where the chemical element 35 collects (coalesces) on the grain boundary 31g. The concentration of the chemical element 35 on the grain boundary 31g is higher as the first electrode 22 where the chemical element 35 coalesces is approached.

For example, the grain boundary 31g may be formed in the chalcogenide compound 31 having the c-axis orientation when manufacturing or when operating. For example, the grain boundary 31g may occur due to the effects of the roughness (the roughness), etc., of the first electrode 22, an insulating film 40, or the like provided around the chalcogenide compound 31. The chemical element 35 precipitates easily on the grain boundary 31g.

Due to the precipitation of the chemical element 35, there is a possibility that a disturbance may occur in the electric field applied to the variable resistance layer 30, the electrical characteristics (e.g., the resistance) may change, and the voltage necessary for the resistance change operation (the state change) of the variable resistance layer 30 also may change. In such a case, there is a possibility that the state change may occur excessively; and a mistaken resistance value may be determined in the operation (Read) of reading the resistance state of the variable resistance layer 30.

The second structure C2 will now be described with reference to FIG. 3A.

Figure 3A:
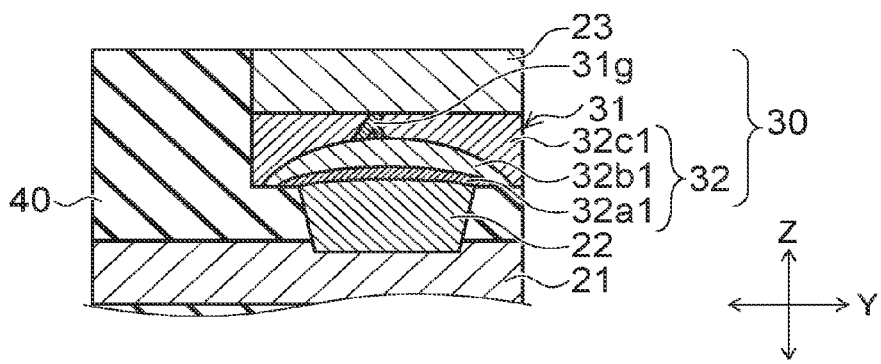
FIGS. 3A to 3D are schematic cross-sectional views of a variable resistance layer of the first embodiment.

As shown in FIG. 3A, the second structure C2 is the structure in which the grain boundary 31g is provided to be discontinuous between the first electrode 22 and the second electrode 23. In the second structure C2, the grain boundary 31g is not provided at the vicinity of the first electrode 22. Therefore, the grain boundary 31g and the region having the high concentration of the chemical element 35 of the variable resistance layer 30 (e.g., the first region 32a1 when in the first state F1) do not overlap.

The length extending in the Z-direction of the grain boundary 31g of the second structure C2 is shorter than the length extending in the Z-direction of the grain boundary 31g of the first structure C1. Also, the density of the grain boundary 31g of the second structure C2 is lower than the density of the grain boundary 31g of the first structure C1. Further, the density of the chemical element 35 included on the grain boundary 31g of the second structure C2 is lower than the density of the chemical element 35 included on the grain boundary 31g of the first structure C1. The density of the grain boundary 31g is the total volume of the grain boundary region per unit surface area.

The third structure C3 will now be described with reference to FIG. 3B.

Figure 3B:
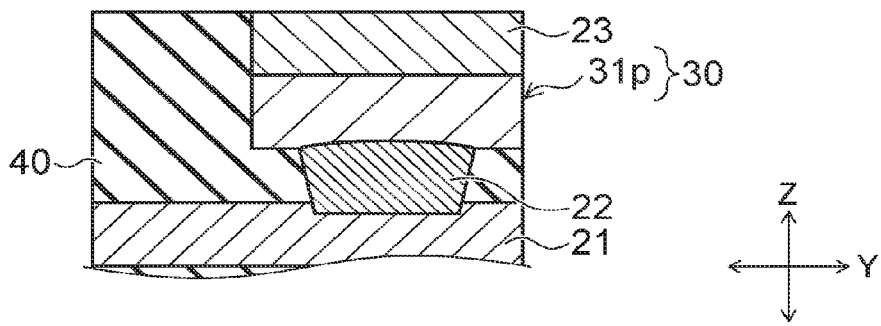

As shown in FIG. 3B, the third structure C3 is a structure in which an amorphous portion 31p of the chalcogenide compound 31 that has a prescribed thickness exists in the current path between the first electrode 22 and the second electrode 23. For example, the third structure C3 is a structure in which the entire chalcogenide compound 31 inside the variable resistance layer 30 is amorphous.

The density of the grain boundary 31g of the third structure C3 is lower than the density of the grain boundary 31g of the first structure C1.

A method for restoring the variable resistance layer 30 having the first structure C1 to the second structure C2 will now be described with reference to FIG. 3C and FIG. 3D. Namely, when a voltage that is larger than the pulse voltage applied in the resistance change operation is applied to the variable resistance layer 30, the concentration distribution of the chemical element 35 inside the chalcogenide compound 31 is caused to disperse; and the grain boundary 31g of the chalcogenide compound 31 can be reduced (a restoring operation S130 of FIG. 5A to FIG. 5C).

Figure 3C:
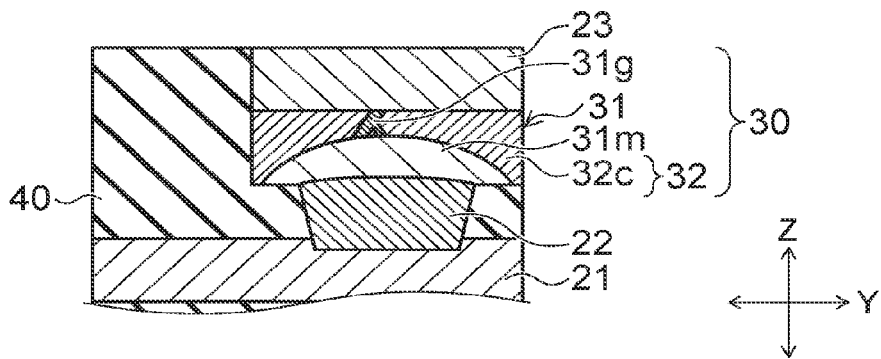

FIG. 3C shows the variable resistance layer 30 when the voltage of the restoring operation S130 is applied to the variable resistance layer 30 of FIG. 2C. Thereby, a melted portion 31m in which the crystal structure of a portion of the chalcogenide compound 31 is melted is provided in the variable resistance layer 30. The chemical element 35 is diffused in the melted portion 31m.

Figure 3D:
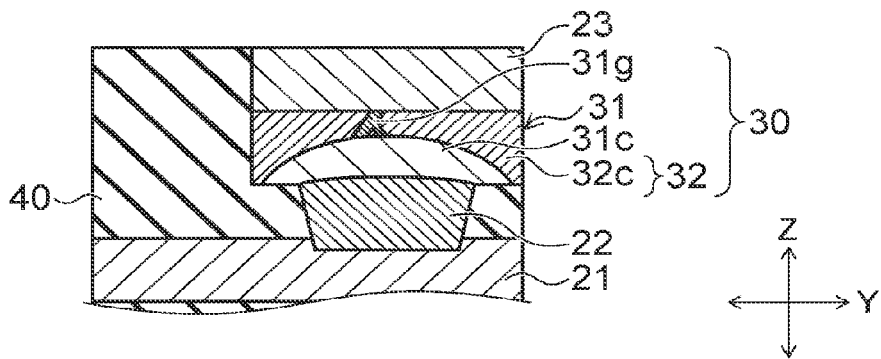

FIG. 3D shows the variable resistance layer 30 after the recrystallization after the voltage is applied to the variable resistance layer 30 of FIG. 3C.

As shown in FIG. 3D, a crystalline portion 31c is provided in the melted portion 31m shown in FIG. 3C. The chemical element 35 is diffused inside the crystalline portion 31c. At this time, the grain boundary 31g shown in FIG. 2C is not provided in the crystalline portion 31c.

FIG. 3A shows the variable resistance layer 30 after the voltage applied in the resistance change operation is applied to the variable resistance layer 30 of FIG. 3D.

As shown in FIG. 3A, the grain boundary 31g is not provided at the portion where the crystalline portion 31c and the melted portion 31m of the chalcogenide compound 31 are provided.

The method for forming the third structure C3 shown in FIG. 3B is described below.

(Method for Manufacturing First Embodiment)

A method for manufacturing a memory device of the embodiment will now be described with reference to FIG. 4A to FIG. 4C. The manufacturing method relating to the configuration under the electrode layer 21 is not shown.

Figure 4A:
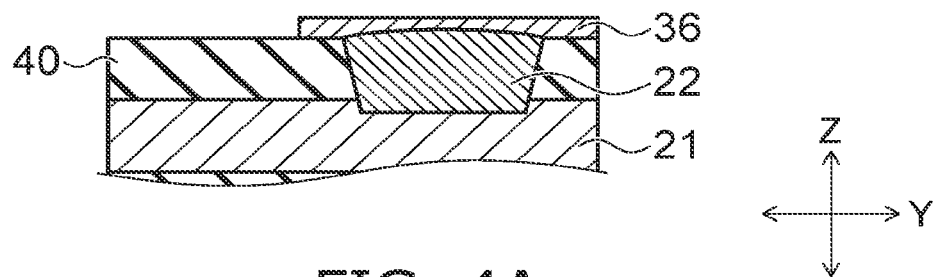
FIGS. 4A to 4C are schematic cross-sectional views showing a method for manufacturing the memory device of the first embodiment.

As shown in FIG. 4A, the first electrode 22 is formed on the electrode layer 21. For example, the insulating film 40 that has a hole is formed on the upper surface of the electrode layer 21; and the first electrode 22 is formed by filling a metal material inside the hole. The diameter of the first electrode 22 is, for example, 100 nm. The first electrode 22 includes, for example, at least one of titanium, tantalum, or tungsten and may be a metal nitride of these components. In the first electrode 22, for example, an insulating film may be formed inside the metal film.

A first layer 36 that includes the chemical element 35 is formed on the first electrode 22. For example, one of sputtering, CVD (chemical vapor deposition), physical vapor deposition, or the like is used as the method for forming the first layer 36. The chemical element 35 includes, for example, at least one of germanium, silicon, or carbon.

Figure 4B:
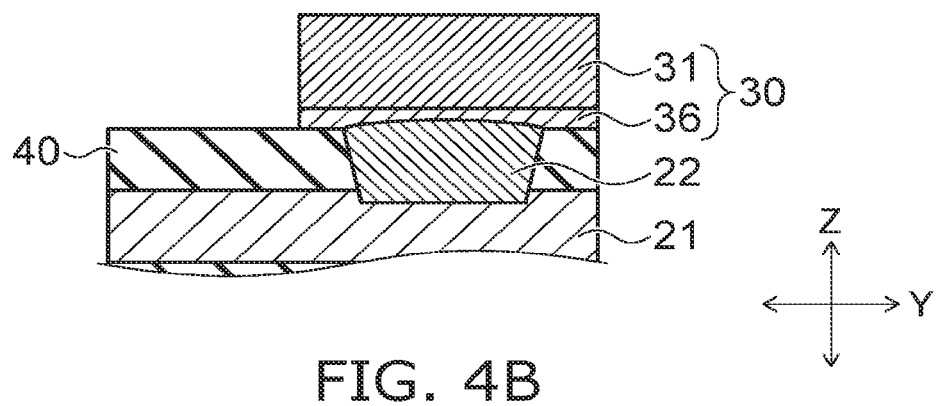

As shown in FIG. 4B, the chalcogenide compound 31 is formed on the first layer 36; and the variable resistance layer 30 is formed. For example, one of sputtering, CVD, physical vapor deposition, or the like is used as the method for forming the chalcogenide compound 31.

When forming the chalcogenide compound 31, for example, the formation is performed in a heated state at 200° C. or more. For example, the heating may be performed after the chalcogenide compound 31 is formed. The crystal defects of the chalcogenide compound 31 are reduced by performing the heating. Further, the chemical element 35 diffuses inside the chalcogenide compound 31 and forms a low-defect solid solution state. The chalcogenide compound 31 has, for example, the c-axis orientation.

The chalcogenide compound 31 includes a compound of at least one type of chemical element selected from the first group and the second group described above and at least one type of chemical element selected from the third group described above.

For example, the chalcogenide compound 31 may be formed on the first electrode 22; and the first layer 36 may be formed on the chalcogenide compound 31.

Figure 4C:
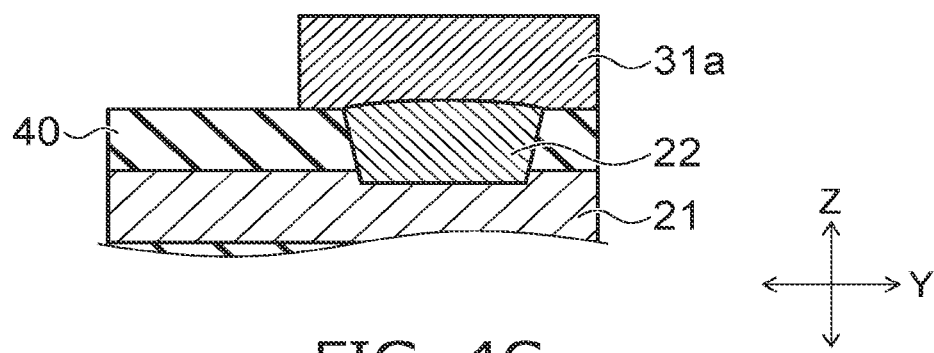

For example, as shown in FIG. 4C, an alloy layer 31a may be formed on the first electrode 22 instead of the first layer 36. The alloy layer 31a includes, for example, a chalcogenide compound including the first group described above.

By applying a direct current voltage or a pulse voltage to the alloy layer 31a, the chalcogenide compound 31 described above in which the chemical element 35 is diffused is formed; and the variable resistance layer 30 is formed. The alloy layer 31a does not melt when the direct current voltage or the pulse voltage described above is applied to the alloy layer 31a.

For example, the alloy layer 31a may be a stacked body including multiple materials (e.g., a stacked body having a superlattice structure). In such a case, the alloy layer 31a includes the material of the chalcogenide compound 31 described above.

As shown in FIG. 1B and FIG. 2, the second electrode 23 is formed on the variable resistance layer 30. Similarly to the first electrode 22, the second electrode 23 may include, for example, at least one of titanium, tantalum, or tungsten and may be a metal nitride of these components. As the second electrode 23, for example, an insulating film may be formed inside the metal film.

Subsequently, the insulating film 40, the contact 24, the first interconnect layer 25, etc., are formed; and the memory device of the embodiment is formed.

(Operation Method Relating to Variable Resistance Layer 30)

An example of the operation method for changing the state of the variable resistance layer 30 and/or the structure of the variable resistance layer 30 will now be described with reference to FIG. 5A to FIG. 8C. In the embodiment and hereinbelow, the voltage value is the voltage value of the second electrode 23 when the first electrode 22 is set to a reference (0 V).

Figure 5A:
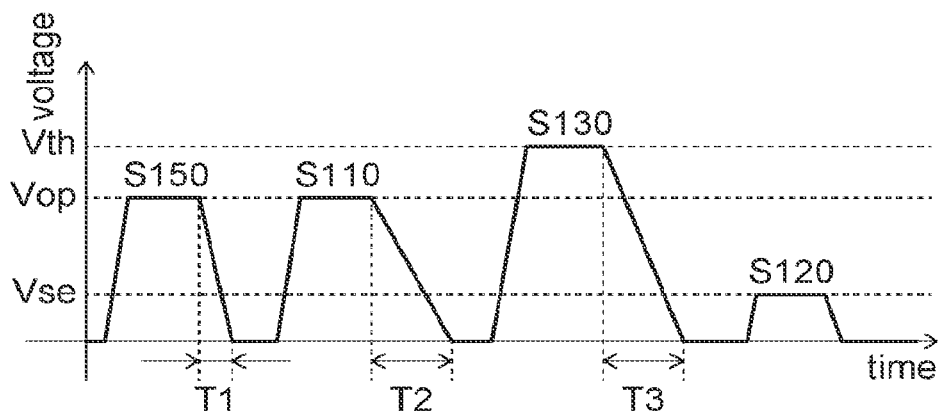
FIG. 5A and FIG. 5B are graphs showing the relationship between time and the voltage value applied to the variable resistance layer.
Figure 5B:
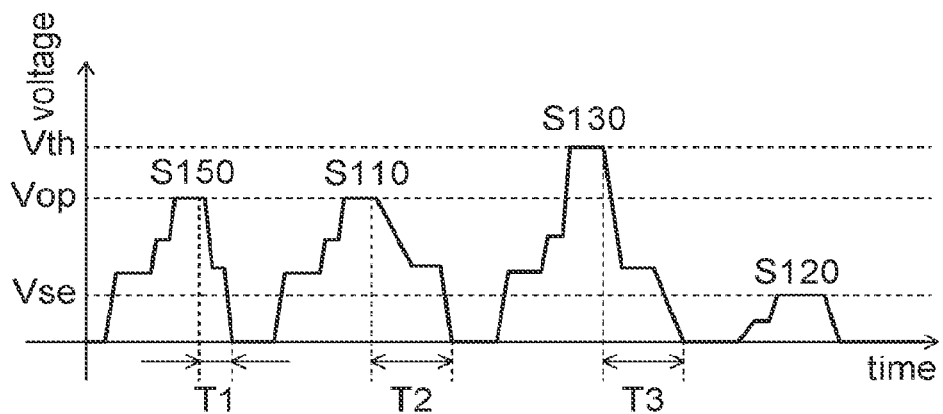
Figure 5C:
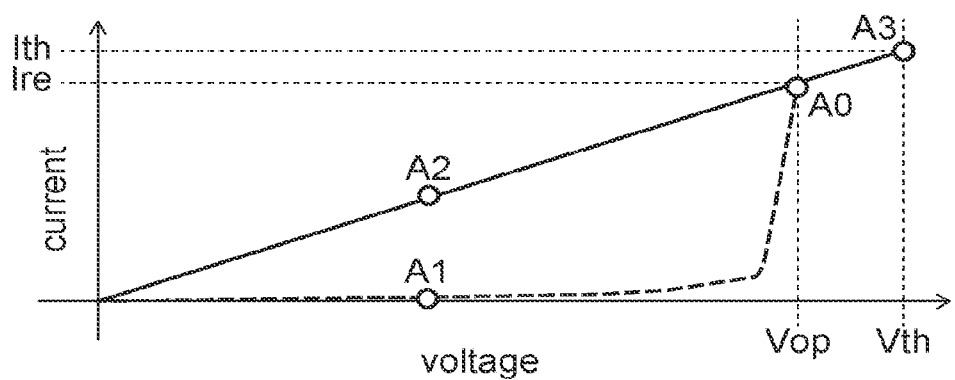
FIG. 5C is a graph showing the relationship between the current value and the voltage value applied to the variable resistance layer.

A first operation method will now be described with reference to FIG. 5A to FIG. 5C. FIG. 5A and FIG. 5B are graphs showing the relationship between time and the voltage value applied to the variable resistance layer 30. FIG. 5C is a graph showing the relationship between the current value and the voltage value applied to the variable resistance layer 30.

The relationship between time and the voltage for each operation will now be described with reference to FIG. 5A and FIG. 5B.

The reset operation S150 will now be described. As shown in FIG. 5A, the reset operation S150 is the operation of ramping-down the applied voltage in a ramp-down time T1 (the time from the maximum voltage value of the pulse voltage to the voltage removal) after a voltage Vop is applied between the first electrode 22 and the second electrode 23. By this operation, the variable resistance layer 30 is switched to the first state F1 and is in the high resistance state.

When the voltage Vop is applied between the first electrode 22 and the second electrode 23, the chemical element 35 drifts inside the variable resistance layer 30 and coalesces on the low voltage (the low potential) electrode side. Joule heat is generated by the current flowing in the electrode; and the drifting of the chemical element 35 is accelerated. It is sufficient for the temperature to which the variable resistance layer 30 is heated by the Joule heat to be a temperature at which the crystal does not melt, e.g., 400° C. or less.

Subsequently, in the case where the applied voltage becomes 0 V in a sufficiently short ramp-down time, the variable resistance layer 30 is cooled (quenched) in a short period of time; and the first state F1 is formed. For example, in the case where the potential of the first electrode 22 is higher than the potential of the second electrode 23, the first region 32a1 in the first state F1 may not contact the upper surface of the first electrode 22 as shown in FIG. 11A described below. In such a case, the first region 32a1 covers the upper surface of the first electrode 22. The second region 32b1 is provided between the first region 32a1 and the first electrode 22 and covers the upper surface of the first electrode 22.

The set operation S110 will now be described. As shown in FIG. 5A, the set operation S110 is an operation of ramping-down the applied voltage in a ramp-down time T2 after the voltage Vop is applied between the first electrode 22 and the second electrode 23. By this operation, the variable resistance layer 30 is switched to the second state F2 and is in the low resistance state.

In the case where the applied voltage becomes 0 V in a sufficiently long ramp-down time after the voltage Vop is applied between the first electrode 22 and the second electrode 23, the variable resistance layer 30 is cooled over time (slowly cooled); and the second state F2 is formed. The pulse ramp-down time T2 of the set operation S110 is longer than the pulse ramp-down time T1 of the reset operation S150.

The value of the voltage Vop described above is not more than a value at which the crystal structure of the chalcogenide compound 31 does not change when repeatedly implementing the set operation S110 and the reset operation S150.

Typically, the pulse width (the voltage input time) when applying the voltage Vop is 50 ns or more. However, according to the film thickness and/or material of the variable resistance layer 30, the pulse width may be less than 50 ns. It is sufficient for the pulse width to be able to increase the voltage to a sufficient voltage; and in the case of a short pulse width, the pulse width may be set to be longer due to concerns of not increasing to the prescribed voltage due to the interconnect delay, etc.

Also, although the pulse ramp-up time is, for example, 10 ns or less, the pulse ramp-up time may be 10 ns or more and is arbitrary. The pulse ramp-down time T1 of the reset operation S150 is, for example, 10 ns or less and may be less than 100 ns. The pulse ramp-down time T2 of the set operation S110 is, for example, 100 ns or more.

For example, as shown in FIG. 5B, the ramp-up of the pulse may ramp-up in steps and may ramp-down in steps. In such a case, the ramp-down times of the voltage Vop are the same as the pulse ramp-down times T1 and T2 described above. Because the pulses of the operations described below are similar, a description is omitted.

The restoring operation S130 will now be described. As shown in FIG. 5A, the restoring operation S130 is, for example, an operation of ramping-down the applied voltage in the ramp-down time T2 similar to that of the set operation S110 after a voltage Vth is applied between the first electrode 22 and the second electrode 23. By this operation, the variable resistance layer 30 changes the first structure C1 to the second structure C2.

The voltage Vth that is used in the restoring operation S130 is higher than the voltage Vop used in the set operation S110 and the reset operation S150 and is, for example, 1.3 times the voltage Vop. Thereby, the melted portion 31m shown in FIG. 3C is formed.

In the case where the applied voltage becomes 0 V in a sufficiently long ramp-down time T2 after the voltage Vth is applied between the first electrode 22 and the second electrode 23, the variable resistance layer 30 is cooled over time; the crystalline portion 31c shown in FIG. 3D is formed; and the grain boundary 31g inside the variable resistance layer 30 can be reduced. Thereby, it is possible to reduce the chemical element 35 precipitated on the grain boundary 31g.

For example, the restoring operation S130 restores so that the variable resistance layer 30 can be controlled by the resistance change operation. For example, the variable resistance layer 30 that has the first structure C1 substantially does not change even when the voltage is applied to the resistance change operation and has, for example, a low resistance value. At this time, the first structure C1 is changed to the second structure C2 by implementing the restoring operation S130 on the variable resistance layer 30. Thereby, the variable resistance layer 30 has a high resistance or low resistance value according to the resistance change operation.

A read-out operation S120 will now be described. The read-out operation S120 is an operation in which a voltage Vse is applied between the first electrode 22 and the second electrode 23 and the electrical resistance of the variable resistance layer 30 is discriminated. More specifically, the read-out operation S120 is performed by detecting the current value or the voltage value supplied to the variable resistance layer 30 by the controller 3.

As shown in FIG. 5A, the voltage Vse that is used in the read-out operation S120 is lower than the voltage Vop used in the set operation S110 and the reset operation S150. Thereby, the electrical resistance of the variable resistance layer 30 can be read without changing the electrical resistance of the variable resistance layer 30.

The relationship between the voltage and the current for the operations S110, S130, and S150 will now be described with reference to FIG. 5C.

The reset operation S150 will now be described. As shown in FIG. 5C, a current Ire is supplied when the voltage Vop is applied between the first electrode 22 and the second electrode 23 (point A0). Subsequently, the voltage Vop is changed to 0 V via point A1. At this time, the variable resistance layer 30 forms the first state F1.

The set operation S110 will now be described. As shown in FIG. 5C, the current Ire is supplied when the voltage Vop is applied between the first electrode 22 and the second electrode 23 (point A0). Subsequently, the voltage Vop is changed to 0 V via point A2. At this time, the variable resistance layer 30 forms the second state F2.

The restoring operation S130 will now be described. As shown in FIG. 5C, a current Ith is supplied when the voltage Vth is applied between the first electrode 22 and the second electrode 23 (point A3). Subsequently, the voltage Vop is changed to 0 V via point A2. At this time, the variable resistance layer 30 forms the second structure C2.

The operations executed on the variable resistance layer 30 will now be described with reference to FIG. 6.

Figure 6:
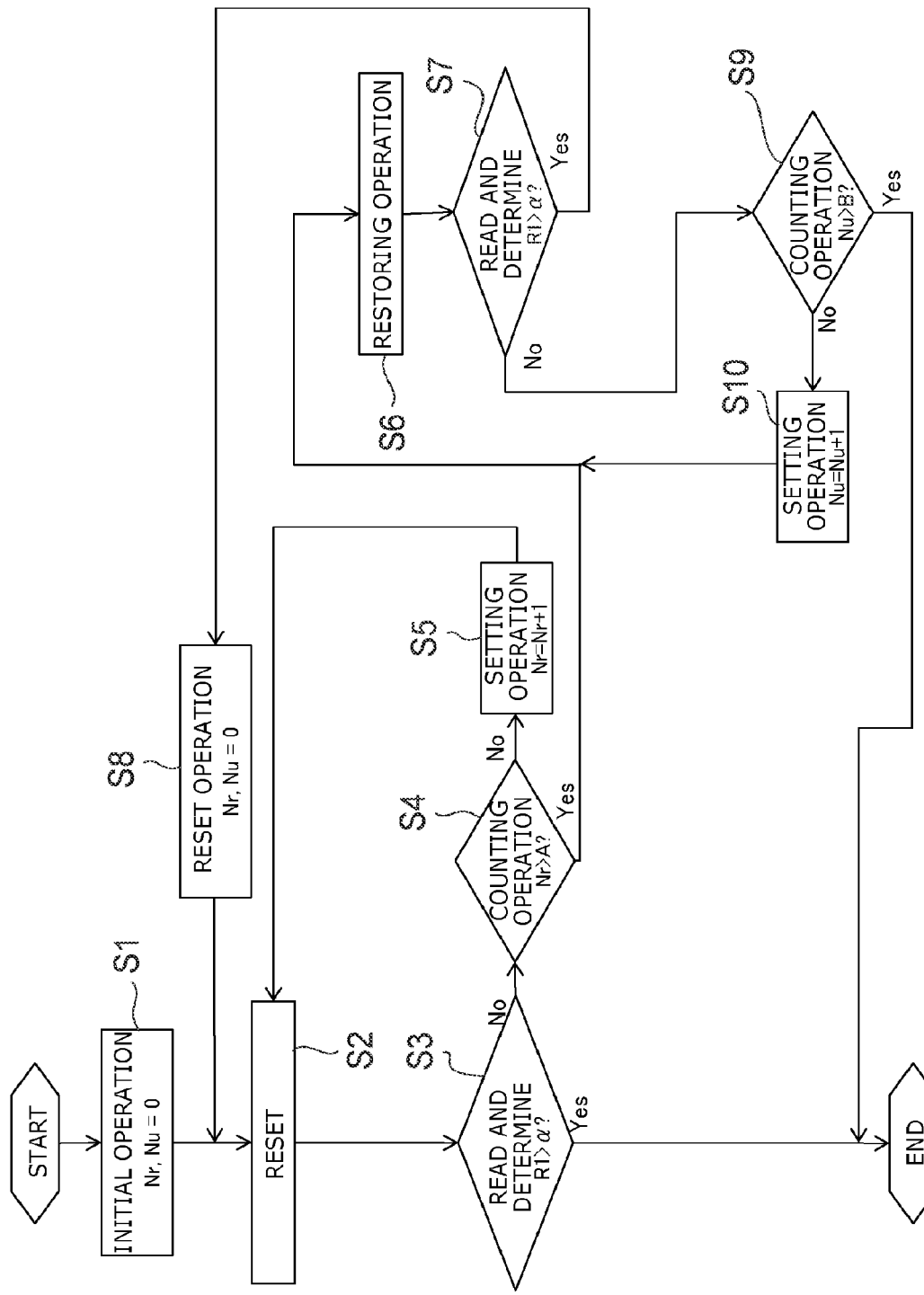
FIG. 6 is a flowchart showing an operation of the first embodiment.

The series of operations shown in FIG. 6 may be performed prior to shipping the memory device 1. Also, only a portion of the operations shown in FIG. 6 may be performed prior to shipping the memory device 1.

An initial operation is performed in step S1. Namely, a number of reset operation implementations Nr and a number of restoring operation implementations Nu are set to 0.

The reset operation S150 is performed in step S2 (a first operation). In the reset operation S150, the voltage Vop (a first voltage) is applied between the first electrode 22 and the second electrode 23.

In step S3, the read-out operation S120 and a determination are performed (a second operation). In the read-out operation S120, the voltage Vse (a second voltage) is applied between the first electrode 22 and the second electrode 23. Then, it is determined whether or not the current value or the voltage value output from the read-out operation S120 is larger than a prescribed value α. Here, it is taken that the resistance value is large when the current value or the voltage value is large.

If the value that is output from the variable resistance layer 30 is larger than the prescribed value α (YES), it is considered that the variable resistance layer 30 does not have the first structure C1. Therefore, the operation ends.

If the value that is output from the variable resistance layer 30 is not more than the prescribed value α (NO), there is a possibility that the variable resistance layer 30 has the first structure C1. Therefore, the operation proceeds to step S5.

That is, in step S3, it is determined whether or not the variable resistance layer 30 has the first structure C1. The prescribed value α is arbitrary; and the determination may be performed by setting a constant range.

In step S4, a counting operation of the reset operation S150 is performed in the register 3a. In the counting operation of the reset operation S150, it is determined whether or not the number of implementations Nr (a first number of times) of the reset operation S150 is larger than a number of settings A.

If the number of implementations Nr is larger than A (YES), the possibility that the variable resistance layer 30 has the first structure C1 is high. Therefore, the operation proceeds to step S6.

If the number of implementations Nr is not more than A (NO), the operation proceeds to step S5 to attempt the reset operation S150 again.

That is, in step S4, it is determined whether or not the resistance is low even when the reset operation S150 is performed and whether or not the possibility that the variable resistance layer 30 has the first structure C1 is high.

The setting operation of the reset operation S150 is performed in step S5. In the setting operation of the reset operation S150, the number of implementations Nr of the reset operation S150 is set to Nr+1. Then, the operation returns to step S2; and the reset operation S150 is performed again.

The restoring operation S130 is performed in step S6 (a third operation). In the restoring operation S130, the voltage Vth (a third voltage) is applied between the first electrode 22 and the second electrode 23.

In step S7, the read-out operation S120 and a determination are performed (a fourth operation). In the read-out operation S120, the voltage Vse (the fourth voltage) is applied between the first electrode 22 and the second electrode 23. Then, it is determined whether or not the current value or the voltage value output from the read-out operation S120 is larger than the prescribed value α. Here, it is taken that the resistance value is large when the current value or the voltage value is large.

If the value that is output from the variable resistance layer 30 is larger than the prescribed value α (YES), it is considered that the variable resistance layer 30 does not have the first structure C1. Therefore, the operation proceeds to step S8. If the value that is output from the variable resistance layer 30 is not more than the prescribed value α (NO), there is a possibility that the variable resistance layer 30 has the first structure C1. Therefore, the operation proceeds to step S9.

The prescribed value α is arbitrary; and the determination may be performed by setting a constant range.

In step S8, the reset operation of the restoring operation S130 and the reset operation S150 are performed. In the reset operation, the number of implementations Nr of the reset operation S150 and the number of implementations Nu of the restoring operation are set to 0.

In step S9, a counting operation of the restoring operation S130 is performed. In the counting operation of the restoring operation S130, it is determined whether or not the number of implementations Nu of the restoring operation S130 is larger than a number of settings B. If the number of implementations Nu is larger than B (YES), the possibility is high that the structure of the variable resistance layer 30 does not change even when the restoring operation S130 is performed. Therefore, the operation ends. If the number of implementations Nu is not more than B (NO), the operation proceeds to step S11 to attempt the restoring operation Nu again.

In step S10, the setting operation of the restoring operation S130 is performed. In the setting operation of the restoring operation S130, the number of implementations Nu of the restoring operation S130 is set to Nu+1.

The timing of implementing the read-out operation S120 using Vse described above is an example; and the timing of implementing the read-out operation is arbitrary. Also, the number of implementations of the reset operation S150 is arbitrary.

(Second Operation Method)

A second operation method will now be described using FIG. 7A to FIG. 7D. In the case of the operation method, the voltages that are used in the set operation S110 and the reset operation S150 are different from each other. A description is omitted for the portions that are the same as the operation method described above.

Figure 7A:
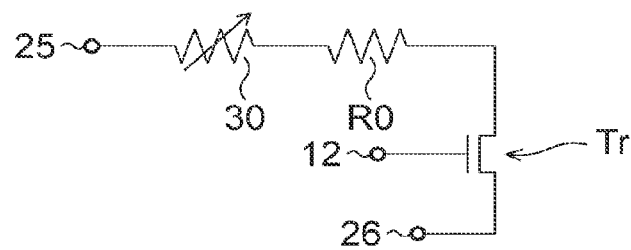
FIG. 7A is a circuit diagram of the memory device of the first embodiment.
Figure 7B:
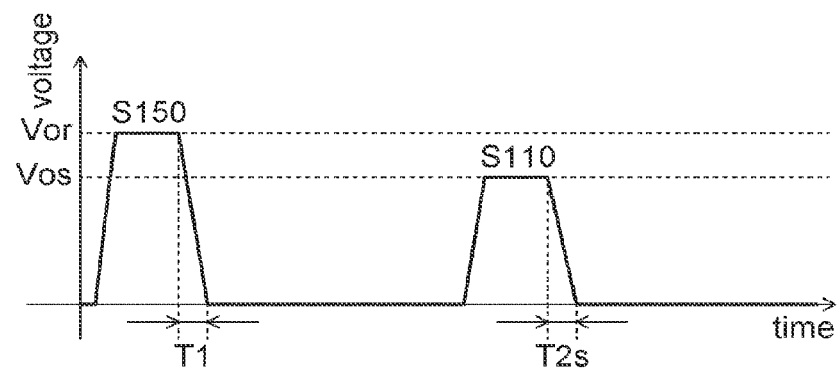
FIG. 7B is a graph showing the relationship between time and the voltage value applied to the variable resistance layer.
Figure 7C:
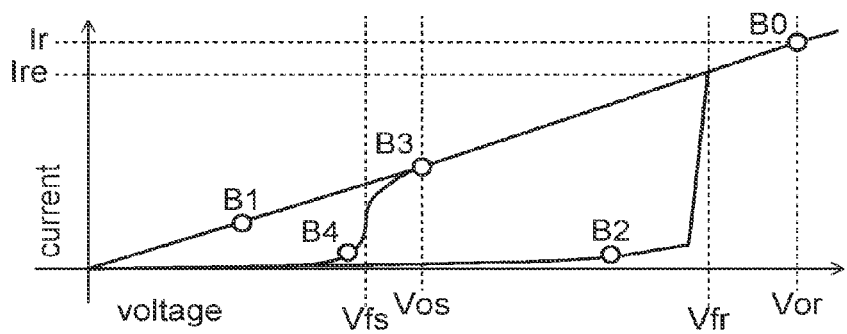
FIG. 7C and FIG. 7D are graphs showing the relationship between the current value and the voltage value applied to the variable resistance layer.
Figure 7D:
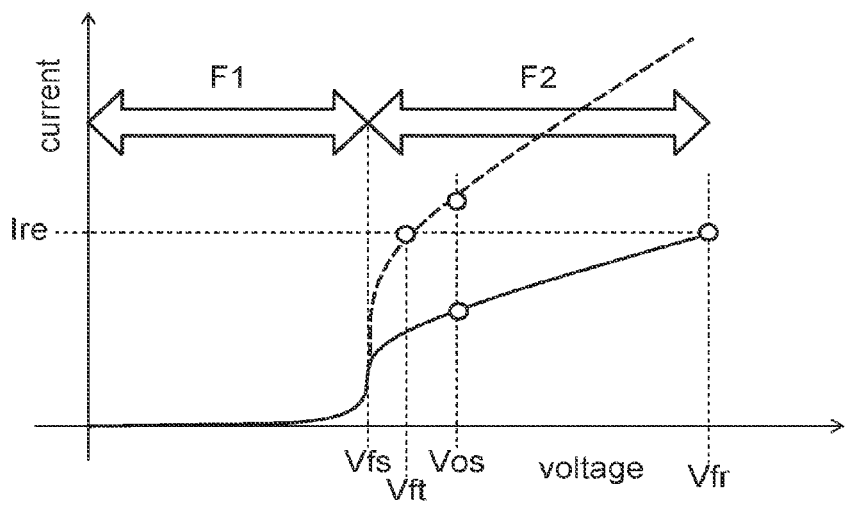

FIG. 7A is a circuit diagram of the memory device 1 of the embodiment; FIG. 7B is a graph showing the relationship between time and the voltage value applied to the variable resistance layer 30; and FIG. 7C and FIG. 7D are graphs showing the relationship between the current value and the voltage value applied to the variable resistance layer 30.

The circuit diagram of the memory device 1 of the operation method will now be described with reference to FIG. 7A.

As shown in FIG. 7A, a resistor R0 is provided between the variable resistance layer 30 and the transistor Tr. The resistance of the resistor R0 is lower than the resistance of the first state F1 of the variable resistance layer 30. For example, the resistance value of the resistor R0 is on the order of the resistance value of the first state F1 or less. The resistance of the resistor R0 is about the same as or less than the resistance of the second state F2 of the variable resistance layer 30.

The relationship between time and the voltage for the operations S110 and S150 will now be described with reference to FIG. 7B.

The reset operation S150 will now be described. As shown in FIG. 7B, the reset operation S150 ramps-down the applied voltage in the ramp-down time T1 after a voltage Vor is applied between the first electrode 22 and the second electrode 23.

The set operation S110 will now be described. As shown in FIG. 7B, the set operation S110 ramps-down the applied voltage in the ramp-down time T2s after a voltage Vos is applied between the first electrode 22 and the second electrode 23. The voltage Vos that is used in the set operation S110 is lower than the voltage Vor used in the reset operation S150. Also, the pulse ramp-down time T2s of the set operation S110 is, for example, the same as the pulse ramp-down time T1 of the reset operation S150 and may be, for example, 100 ns or less.

The relationship between the voltage and the current for the operations S110 and S150 will now be described with reference to FIG. 7C. A voltage Vfr is the minimum applied voltage used in the reset operation S150; and a voltage Vfs is the minimum applied voltage of the set operation S110. The operations S110 and S150 change the state of the variable resistance layer 30 by using voltages that are not less than the minimum applied voltages Vfs and Vfr.

The reset operation S150 will now be described. As shown in FIG. 7C, a current Ir is supplied when the voltage Vor is applied between the first electrode 22 and the second electrode 23 (point B0). At this time, the voltage Vor is applied via points B1 and B3. Subsequently, the voltage Vor is changed to 0 V via point B2. Thereby, the variable resistance layer 30 forms the first state F1. In other words, in the reset operation S150, the state of the variable resistance layer 30 is changed by supplying the current Ir that is not less than the current Ire.

The set operation S110 will now be described. As shown in FIG. 7C, when the variable resistance layer 30 is taken to be in the first state F1, the voltage Vos is applied between the first electrode 22 and the second electrode 23 via point B4 (point B3). The voltage Vos is lower than the voltage Vor. Subsequently, the voltage Vos is changed to 0 V via point B1. Thereby, the variable resistance layer 30 forms the second state F2. In other words, in the set operation S110, the state of the variable resistance layer 30 is changed by using the voltage Vos that is not less than the minimum applied voltage Vfs.

The relationship between the voltage and the current in the case where the resistor R0 is provided will now be described with reference to FIG. 7D. The dashed line of FIG. 7D illustrates the relationship between the voltage and the current in the case where the resistor R0 is not provided; and the solid line of FIG. 7D illustrates the relationship between the voltage and the current in the case where the resistor R0 is provided. A voltage Vft is the minimum applied voltage of the reset operation S150 in the case where the resistor R0 is not provided.

As shown in FIG. 7D, the current Ire is supplied when the minimum applied voltage Vft is applied between the first electrode 22 and the second electrode 23. The minimum applied voltage Vft is lower than the voltage Vos. Conversely, the minimum applied voltage Vfr in the case where the resistor R0 is used is higher than the voltage Vos. In other words, the minimum applied voltage of the reset operation S150 is higher.

Here, as described above, the resistance of the resistor R0 is lower than the resistance of the first state F1 of the variable resistance layer 30. Thereby, in the first state F1, the effect of the voltage drop due to the resistor R0 is small. Therefore, the minimum applied voltage Vfs of the set operation S110 of changing from the first state F1 to the second state F2 substantially does not change regardless of the existence or absence of the resistor R0.

Conversely, the resistance of the resistor R0 is about the same as or less than the resistance of the second state F2 of the variable resistance layer 30. That is, the effect of the voltage drop due to the resistor R0 is larger in the second state F2 than in the first state F1. Therefore, in the reset operation S150 of changing from the second state F2 to the first state F1, the supply amount of the current for the applied voltage decreases because the resistor R0 is disposed. Thereby, the minimum applied voltage that can supply the current Ire necessary for the state change of the variable resistance layer 30 changes to the voltage Vfr which is higher than the voltage Vft.

Due to the description recited above, by providing the resistor R0, the voltage Vor that is used in the reset operation S150 is higher than the voltage Vos used in the set operation S110.

In the operation method as well, it is possible to perform the restoring operation S130 described above. In such a case, for example, the voltage Vth that is higher than the voltage Vor used in the reset operation S150 is used in the restoring operation S130.

(Third Operation Method)

A third operation method will now be described using FIG. 8A to FIG. 8C. In the case of the operation method, a negative voltage −Vt is used in the reset operation S150; and a positive voltage Vt is used in the set operation S110. A description is omitted for the portions that are the same as those of the operation methods described above.

Figure 8A:
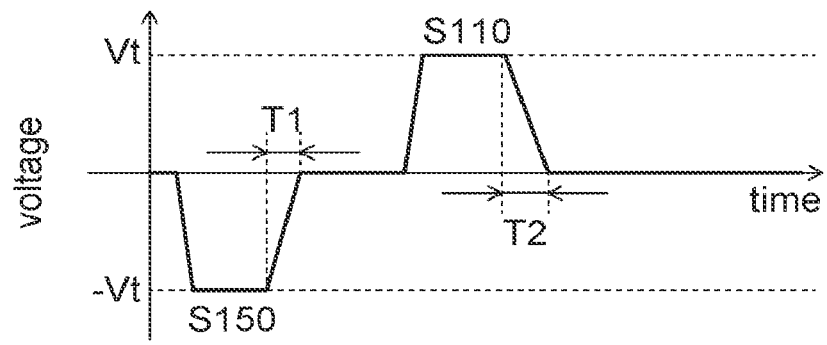
FIG. 8A and FIG. 8B are graphs showing the relationship between time and the voltage value applied to the variable resistance layer.
Figure 8B:
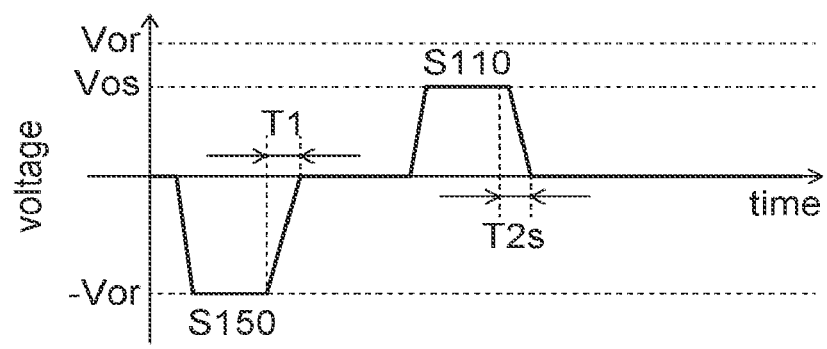
Figure 8C:
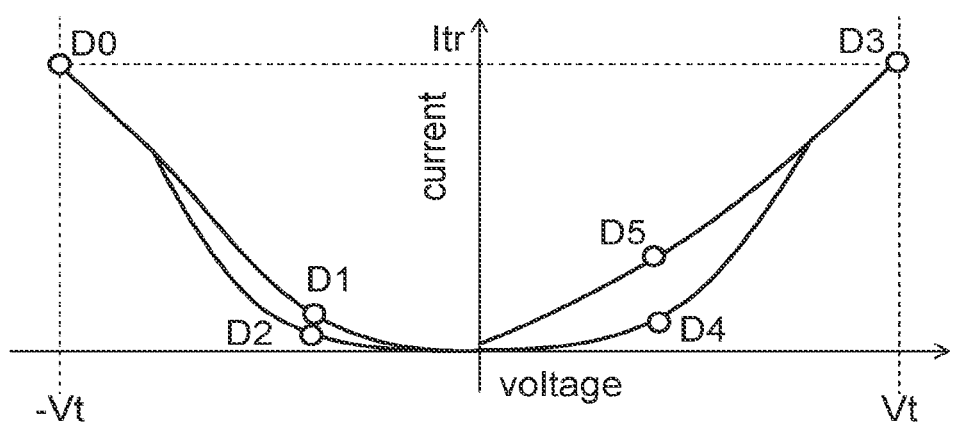
FIG. 8C is a graph showing the relationship between the current value and the voltage value applied to the variable resistance layer.

FIG. 8A and FIG. 8B are graphs showing the relationship between time and the voltage value applied to the variable resistance layer 30; and FIG. 8C is a graph showing the relationship between the current value and the voltage value applied to the variable resistance layer 30.

The reset operation S150 will now be described. As shown in FIG. 8A, the reset operation S150 ramps-down the voltage application in the ramp-down time T1 after the negative voltage −Vt is applied between the first electrode 22 and the second electrode 23.

The set operation S110 will now be described. As shown in FIG. 8A, the set operation S110 ramps-down the voltage application in the ramp-down time T2 after the positive voltage Vt is applied between the first electrode 22 and the second electrode 23. Similarly to the operation method described above, the ramp-down time T2 is longer than the ramp-down time T1 of the reset operation S150.

For example, as shown in FIG. 8B, the set operation S110 may be performed to match the second operation method described above. Namely, the reset operation S150 uses a voltage −Vor; and the set operation S110 uses the voltage Vos that is lower than the voltage Vor. At this time, it is possible to shorten the pulse ramp-down time T2s of the set operation S110 to be, for example, 100 ns or less.

The relationship between the voltage and the current for the operations S110 and S150 will now be described with reference to FIG. 8C.

The reset operation S150 will now be described. As shown in FIG. 8C, a current Itr is supplied when the voltage −Vt is applied between the first electrode 22 and the second electrode 23 (point D0). At this time, the voltage is applied via point D1.

Subsequently, the voltage −Vt is changed to 0 V via point D2. At this time, the variable resistance layer 30 forms the first state F1.

The set operation S110 will now be described. As shown in FIG. 8C, the current Itr is supplied when the voltage Vt is applied between the first electrode 22 and the second electrode 23 (point D3). At this time, the voltage is applied via point D4.

Subsequently, the voltage Vt is changed to 0 V via point D5. At this time, the variable resistance layer 30 forms the second state F2.

In the operation method as well, it is possible to perform the restoring operation S130 of the variable resistance layer 30 described above. In such a case, for example, the positive voltage Vth is used in the restoring operation S130.

(Modification of Variable Resistance Layer 30)

Other examples of the state of the variable resistance layer 30 will now be described with reference to FIG. 9A to FIG. 12E.

Examples of the variable resistance layer 30 in the first state F1 will now be described with reference to FIG. 9A and FIG. 9B.

Figure 9A:
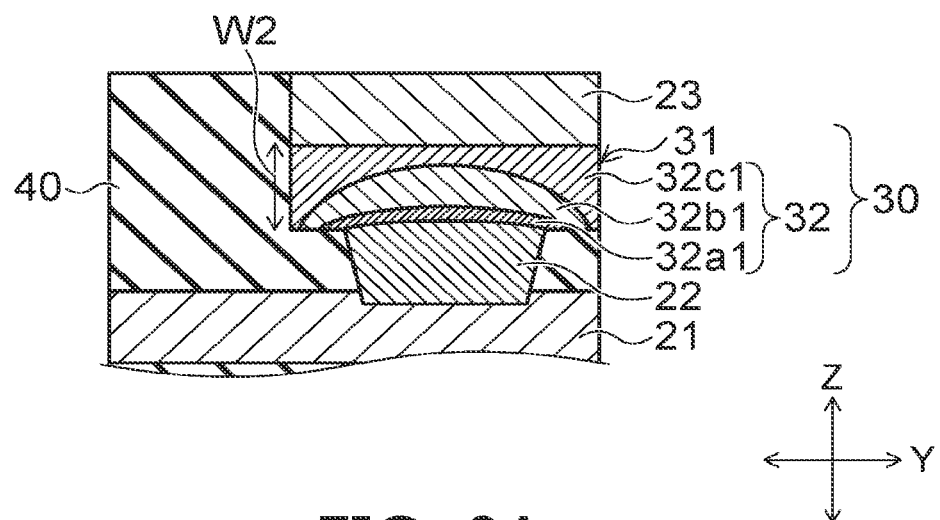
FIG. 9A and FIG. 9B are schematic cross-sectional views of a variable resistance layer of the first embodiment.

As shown in FIG. 9A, unlike FIG. 2A, the second region 32b1 is separated from the lower surface of the second electrode 23 inside the variable resistance layer 30. The third region 32c1 covers the upper surface of the second region 32b1. The third region 32c1 covers the lower surface of the second electrode 23.

For example, a thickness W2 in the Z-direction of the variable resistance layer 30 is thicker than the thickness W1 shown in FIG. 2A. For example, the amount of the chemical element 35 included inside the variable resistance layer 30 is more than the amount of the chemical element 35 included inside the variable resistance layer 30 shown in FIG. 2A.

Figure 9B:
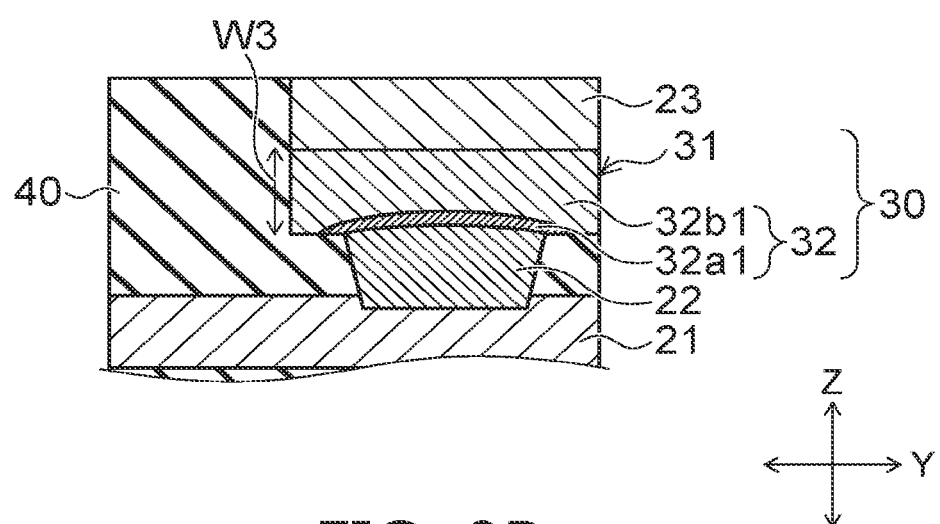

As shown in FIG. 9B, unlike FIG. 2A, the second region 32b1 is provided in the region inside the variable resistance layer 30 other than the region where the first region 32a1 is provided. The second region 32b1 covers the lower surface of the second electrode 23.

For example, a thickness W3 in the Z-direction of the variable resistance layer 30 is thinner than the thickness W1 shown in FIG. 2A. For example, the amount of the chemical element 35 included inside the variable resistance layer 30 is less than the amount of the chemical element 35 included inside the variable resistance layer 30 shown in FIG. 2A.

The variable resistance layer 30 in the second state F2 will now be described with reference to FIG. 10A to FIG. 10D.

Figure 10A:
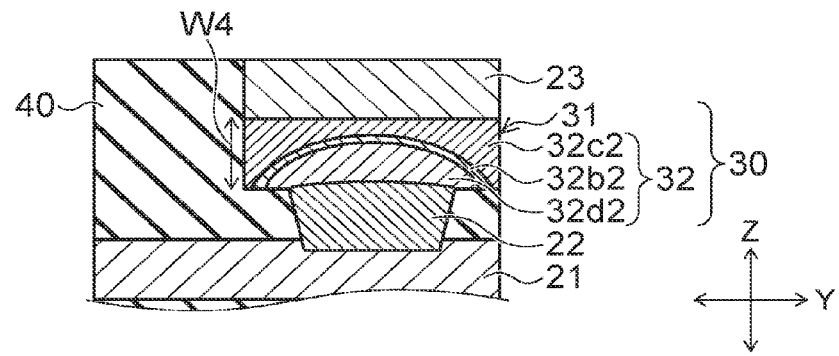
FIGS. 10A to 10D are schematic cross-sectional views of a variable resistance layer of the first embodiment.

As shown in FIG. 10A, unlike FIG. 2B, the second region 32b2 is separated from the lower surface of the second electrode 23 inside the variable resistance layer 30. The third region 32c2 covers the upper surface of the second region 32b2. The third region 32c2 covers the lower surface of the second electrode 23.

For example, a thickness W4 in the Z-direction of the variable resistance layer 30 is thicker than the thickness W1 shown in FIG. 2B. For example, the amount of the chemical element 35 included inside the variable resistance layer 30 is more than the amount of the chemical element 35 included inside the variable resistance layer 30 shown in FIG. 2B.

Figure 10B:
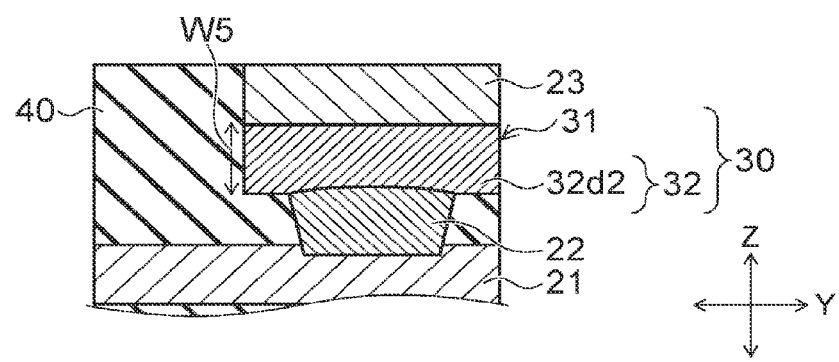

As shown in FIG. 10B, unlike FIG. 2B, the fourth region 32d2 covers the upper surface of the first electrode 22 and the lower surface of the second electrode 23 and is provided to be continuous in the Z-direction inside the variable resistance layer 30. The fourth region 32d2 contacts the upper surface of the first electrode 22 and the lower surface of the second electrode 23.

For example, a thickness W5 of the variable resistance layer 30 is thinner than the thickness W1 shown in FIG. 2B. For example, the amount of the chemical element 35 included inside the variable resistance layer 30 is less than the amount of the chemical element 35 included inside the variable resistance layer 30 shown in FIG. 2B.

Figure 10C:
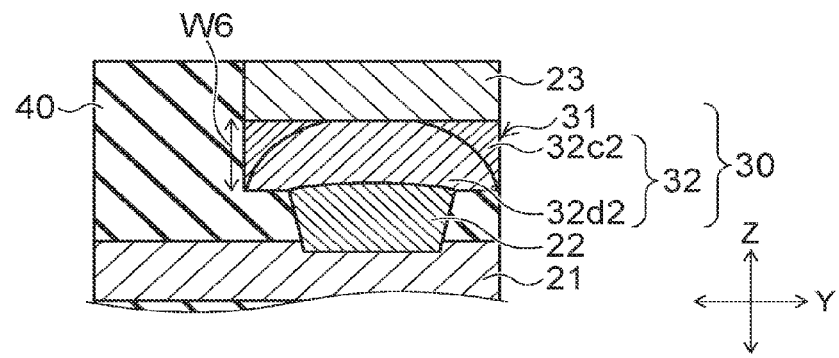

As shown in FIG. 10C, unlike FIG. 2B, the fourth region 32d2 contacts the lower surface of the second electrode 23 inside the variable resistance layer 30. The third region 32c2 contacts the upper surface of the fourth region 32d2 and the lower surface of the second electrode 23.

For example, the amount of the chemical element 35 included inside the variable resistance layer 30 is more than the amount of the chemical element 35 included inside the variable resistance layer 30 shown in FIG. 2B.

Figure 10D:
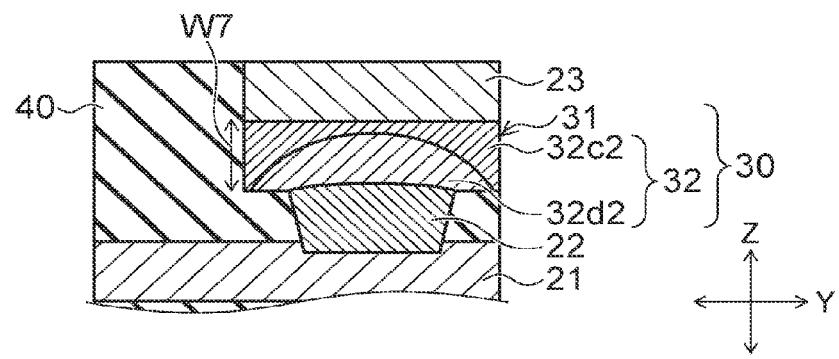

As shown in FIG. 10D, unlike FIG. 2B, the third region 32c2 covers the upper surface of the fourth region 32d2 inside the variable resistance layer 30. The third region 32c2 covers the lower surface of the second electrode 23.

For example, a thickness W7 of the variable resistance layer 30 is thicker than the thickness W1 shown in FIG. 2B. For example, the amount of the chemical element 35 included inside the variable resistance layer 30 is more than the amount of the chemical element 35 included inside the variable resistance layer 30 shown in FIG. 2B.

Examples of the variable resistance layer 30 when the potential of the first electrode 22 is higher than the potential of the second electrode 23 will now be described with reference to FIG. 11A to FIG. 12E.

When the potential of the first electrode 22 is higher than the potential of the second electrode 23, the chemical element 35 collects on the second electrode 23 side. In FIG. 11A to FIG. 12E, the current density is higher in the first electrode 22 than in the second electrode 23; and the first electrode 22 upper portion is heated by Joule heat. Thereby, the diffusion of the chemical element 35 of the second electrode 23 lower portion which is at a low temperature is delayed. Therefore, the change of the concentration gradient of the chemical element 35 is small. On the other hand, the diffusion of the chemical element 35 of the first electrode 22 upper portion is accelerated. Therefore, the change of the concentration gradient of the chemical element 35 is large.

Examples of the variable resistance layer 30 in the first state F1 will now be described with reference to FIG. 11A to FIG. 11D.

As shown in FIG. 11A, the first region 32a1 covers the upper surface of the first electrode 22. The first region 32a1 contacts the lower surface of the second electrode 23. The second region 32b1 is provided between the first region 32a1 and the first electrode 22 and covers the upper surface of the first electrode 22. The third region 32c1 is provided in the region other than the region where the first region 32a1 and the second region 32b1 are provided. The third region 32c1 contacts the lower surface of the second electrode 23.

As shown in FIG. 11B, unlike FIG. 11A, the second region 32b1 is provided around the first region 32a1 inside the variable resistance layer 30. The second region 32b1 contacts the lower surface of the second electrode 23 and the first region 32a1.

For example, a thickness W9 in the Z-direction of the variable resistance layer 30 is thinner than a thickness W8 shown in FIG. 11A. For example, the amount of the chemical element 35 included inside the variable resistance layer 30 is less than the amount of the chemical element 35 included inside the variable resistance layer 30 shown in FIG. 11A.

As shown in FIG. 11C, unlike FIG. 11A, the first region 32a1 is separated from the second electrode 23 inside the variable resistance layer 30. The third region 32c1 covers the first region 32a1. The third region 32c1 covers the lower surface of the second electrode 23.

For example, a thickness W10 in the Z-direction of the variable resistance layer 30 is thicker than the thickness W8 shown in FIG. 11A. For example, the amount of the chemical element 35 included inside the variable resistance layer 30 is more than the amount of the chemical element 35 included inside the variable resistance layer 30 shown in FIG. 11A.

As shown in FIG. 11D, unlike FIG. 11A, the first region 32a1 is separated from the second electrode 23 inside the variable resistance layer 30. The second region 32b1 covers the first region 32a1.

For example, a thickness W11 in the Z-direction of the variable resistance layer 30 is thicker than the thickness W8 shown in FIG. 11A. For example, the amount of the chemical element 35 included inside the variable resistance layer 30 is less than the amount of the chemical element 35 included inside the variable resistance layer 30 shown in FIG. 11A.

In FIG. 11A to FIG. 11D as well, similarly to the variable resistance layer 30 in the first state F1 shown in FIG. 2A, the first region 32a1 is provided on a line linking the first electrode 22 and the second electrode 23 inside the variable resistance layer 30. In other words, the first region 32a1 is provided in the current path between the first electrode 22 and the second electrode 23. Thereby, the resistance of the variable resistance layer 30 in the first state F1 becomes high.

Examples of the variable resistance layer 30 in the second state F2 will now be described with reference to FIG. 12A to FIG. 12E.

Figure 12A:
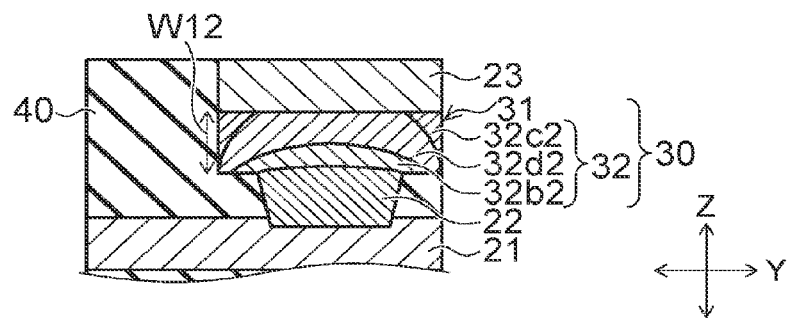
FIGS. 12A to 12E are schematic cross-sectional views of a variable resistance layer of the first embodiment.

As shown in FIG. 12A, the fourth region 32d2 covers the upper surface of the first electrode 22. The fourth region 32d2 contacts the lower surface of the second electrode 23. The second region 32b2 is provided between the fourth region 32d2 and the first electrode 22 and covers the upper surface of the first electrode 22. The third region 32c2 is provided in the region other than the region where the fourth region 32d2 and the second region 32b2 are provided.

Figure 12B:
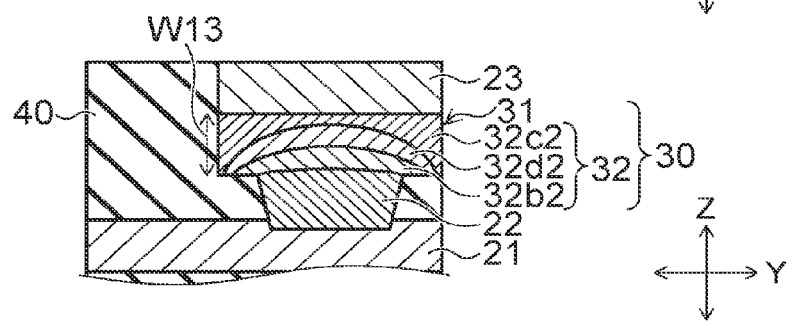

As shown in FIG. 12B, unlike FIG. 12A, the fourth region 32d2 is separated from the second electrode 23 inside the variable resistance layer 30. The third region 32c2 covers the upper surface of the fourth region 32d2. The third region 32c2 covers the lower surface of the second electrode 23.

For example, a thickness W13 in the Z-direction of the variable resistance layer 30 is thicker than a thickness W12 shown in FIG. 12A. For example, the amount of the chemical element 35 included inside the variable resistance layer 30 is more than the amount of the chemical element 35 included inside the variable resistance layer 30 shown in FIG. 12A.

Figure 12C:
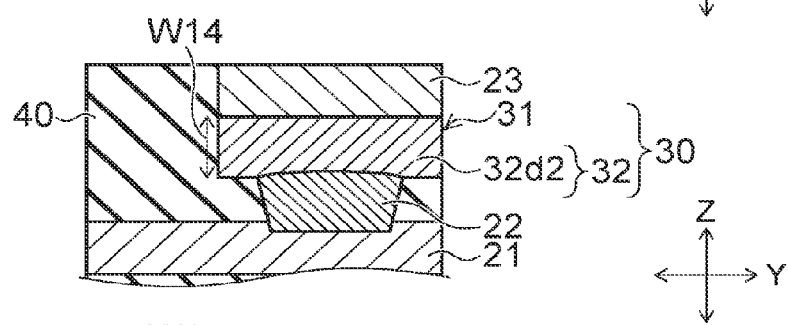

As shown in FIG. 12C, unlike FIG. 12A, the fourth region 32d2 covers the upper surface of the first electrode 22 and the lower surface of the second electrode 23 and is provided to be continuous in the Z-direction inside the variable resistance layer 30. The fourth region 32d2 contacts the upper surface of the first electrode 22 and the lower surface of the second electrode 23.

For example, a thickness W14 in the Z-direction of the variable resistance layer 30 is thinner than the thickness W12 shown in FIG. 12A. For example, the amount of the chemical element 35 included inside the variable resistance layer 30 is more than the amount of the chemical element 35 included inside the variable resistance layer 30 shown in FIG. 12A.

Figure 12D:
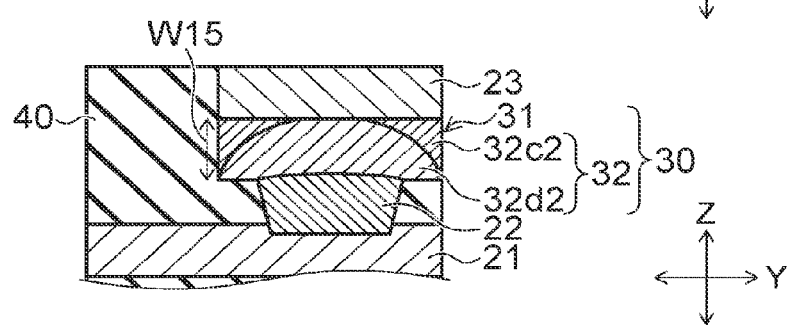

As shown in FIG. 12D, unlike FIG. 12A, the fourth region 32d2 contacts the upper surface of the first electrode 22 and the lower surface of the second electrode 23 inside the variable resistance layer 30. The third region 32c2 contacts the lower surface of the second electrode 23 and the fourth region 32d2.

For example, the amount of the chemical element 35 included inside the variable resistance layer 30 is more than the amount of the chemical element 35 included inside the variable resistance layer 30 shown in FIG. 12A.

Figure 12E:
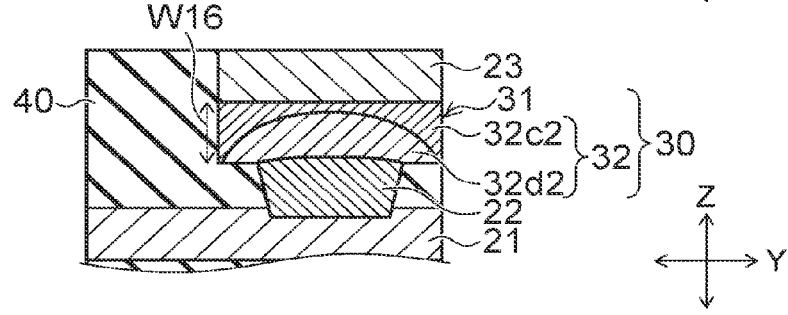

As shown in FIG. 12E, unlike FIG. 12A, the fourth region 32d2 is separated from the second electrode 23 inside the variable resistance layer 30. The fourth region 32d2 contacts the upper surface of the first electrode 22. The third region 32c2 covers the upper surface of the fourth region 32d2. The third region 32c2 covers the lower surface of the second electrode 23.

For example, a thickness W16 in the Z-direction of the variable resistance layer 30 is thicker than the thickness W12 shown in FIG. 12A. For example, the amount of the chemical element 35 included inside the variable resistance layer 30 is more than the amount of the chemical element 35 included inside the variable resistance layer 30 shown in FIG. 12A.

In FIG. 12A to FIG. 12E as well, similarly to the variable resistance layer 30 of the second state F2 shown in FIG. 2B, the first region 32a1 which has high resistance is not provided on a line linking the first electrode 22 and the second electrode 23 inside the variable resistance layer 30. In other words, the first region 32a1 which has high resistance is not provided in the current path between the first electrode 22 and the second electrode 23. Thereby, the resistance of the variable resistance layer 30 in the second state F2 is lower than the resistance of the variable resistance layer 30 in the first state F1.

The concentration of the chemical element 35 for the regions 32a1 to 32d2 described above is not necessarily constant inside the regions and has some fluctuation. For example, the range of the fluctuation is within a range that satisfies the conditions of Formula (1) and Formula (2) described above.

Effects of the embodiment will now be described.

According to the embodiment, the restoring operation S130 is included in addition to the resistance change operations S110 and S150.

For example, when forming the variable resistance layer 30 that includes the chalcogenide compound 31, a film that has a polycrystalline structure is formed; and the grain boundary 31g may be included. Further, as the resistance change operations S110 and S150 of the variable resistance layer 30 are repeatedly performed, the density of the grain boundary 31g becomes high; and impurities and/or unbonded atoms (e.g., the chemical element 35) are stored in the grain boundary 31g. Thereby, the chemical element 35 that is on the grain boundary 31g is biased on the electrodes 22 and 23, the chemical element 35 causes the characteristics of the variable resistance layer 30 to degrade; and there is a possibility that the number of resistance changes may decrease. Further, for example, the density of the grain boundary 31g is biased on the electrodes 22 and 23. Thereby, characteristic fluctuation of the variable resistance layer 30 occurs.

Conversely, according to the embodiment, in the restoring operation S130, the voltage Vth is applied between the first electrode 22 and the second electrode 23, the voltage Vth is higher than the voltage Vop used in the resistance change operations S110 and S150. Thereby, the density of the grain boundary 31g inside the chalcogenide compound 31 can be reduced; and the portions where the chemical element 35 and/or the impurities precipitate easily can be reduced.

For example, the variable resistance layer 30 that includes the first structure C1 may be in either the first state F1 or the second state F2. When the variable resistance layer 30 is in the first state F1, the first region 32a1 and the grain boundary 31g overlap; and the density of the chemical element 35 on the grain boundary 31g may become high.

Thereby, in the first state F1, for example, the resistance when having the first structure C1 is lower than the resistance when having the second structure C2. Therefore, when the variable resistance layer 30 has the first structure, the variable resistance layer 30 is in the low resistance state regardless of the states F1 and F2. Therefore, there is a possibility that the variable resistance layer 30 cannot be controlled by the resistance change operation.

Conversely, according to the embodiment, the grain boundary 31g can be reduced in the portion overlapping the first region 32a1 by the restoring operation S130.

Thereby, the fluctuation of the resistance value can be reduced; and it is possible to obtain stable electrical characteristics. Due to the description recited above, the fluctuation of the resistance value caused by repeatedly performing the resistance change operation can be suppressed; and it is possible to increase the number of resistance changes.

In addition to the description recited above, according to the embodiment, the variable resistance layer 30 has the first state F1 and the second state F2 which have different concentrations of the chemical element 35. The resistance state of the variable resistance layer 30 can be controlled by changing the concentration distribution of the chemical element 35 using heat and at least one of an electric field or stress.

Also, the crystal structure of the chalcogenide compound 31 does not change in the first state F1 and the second state F2. Therefore, compared to an element in which the resistance is changed by melting the variable resistance layer 30, it is possible to perform the control of the states using a low voltage; and it is possible to increase the number of resistance changes.

In the first state F1 of the variable resistance layer 30, the first region 32a1 that has a high concentration of the chemical element 35 covers the first electrode 22. Thereby, the first region 32a1 that has high resistance can be provided in the current path between the first electrode 22 and the second electrode 23; and stable electrical characteristics can be obtained.

Further, by the variable resistance layer 30 including the chalcogenide compound 31, the difference between the resistance value of the first state F1 and the resistance value of the second state F2 of the variable resistance layer 30 can be set to be large. Further, by including the chalcogenide compound 31, the formation of the variable resistance layer 30 having the arrangement described above becomes easy.

In addition to the description recited above, for example, titanium nitride is used as the first electrode 22 and the second electrode 23. Thereby, the chemical element 35 can be prevented from penetrating inside the first electrode 22 and inside the second electrode 23.

According to the manufacturing method of the embodiment described above, it is possible to easily form the chalcogenide compound 31 that operates at a low voltage using few film formation processes and heat treatment. Further, the chalcogenide compound 31 that withstands process temperatures of 330 degrees or more can be provided.

In addition to the description recited above, the heat amount of the Joule heat generated by the voltage applied when changing the resistance of the variable resistance layer 30 is lower than the heat amount for melting the chalcogenide compound 31. Therefore, the chalcogenide compound 31 maintains the crystal structure. In other words, control of the resistance change operation is possible at low voltage/low current that does not melt the chalcogenide compound 31.

According to the second operation method of the embodiment described above, by providing the resistor R0, different voltages can be used in the set operation S110 and the reset operation S150. Thereby, the pulse ramp-down time of the set operation S110 can be set to be short; and a high-speed operation is possible.

For example, the set operation S110 applies the voltage Vos between the first electrode 22 and the second electrode 23. At this time, the current flows in the first electrode 22, the second electrode 23, and the variable resistance layer 30 due to the voltage Vos that is lower than the minimum applied voltage Vfr used in the reset operation S150; and the Joule heat is generated. Thereby, the chemical element 35 is diffused by the heating; and the variable resistance layer 30 changes from the first state F1 to the second state F2. Therefore, the second state F2 of the variable resistance layer 30 is formed regardless of the pulse ramp-down time T2 of the set operation S110.

According to the third operation method of the embodiment described above, the negative voltage −Vt is used in the reset operation S150; and the positive voltage Vt is used in the set operation S110. In such a case, in the reset operation S150, the first state F1 can be formed even in the case where the pulse ramp-down time is long due to the effects of the parasitic capacitance and the resistance when applying the negative voltage −Vt and modifying to 0 V. In other words, it is possible to not form the second state F2 when the negative voltage −V is applied.

Second Embodiment

Figure 13A:
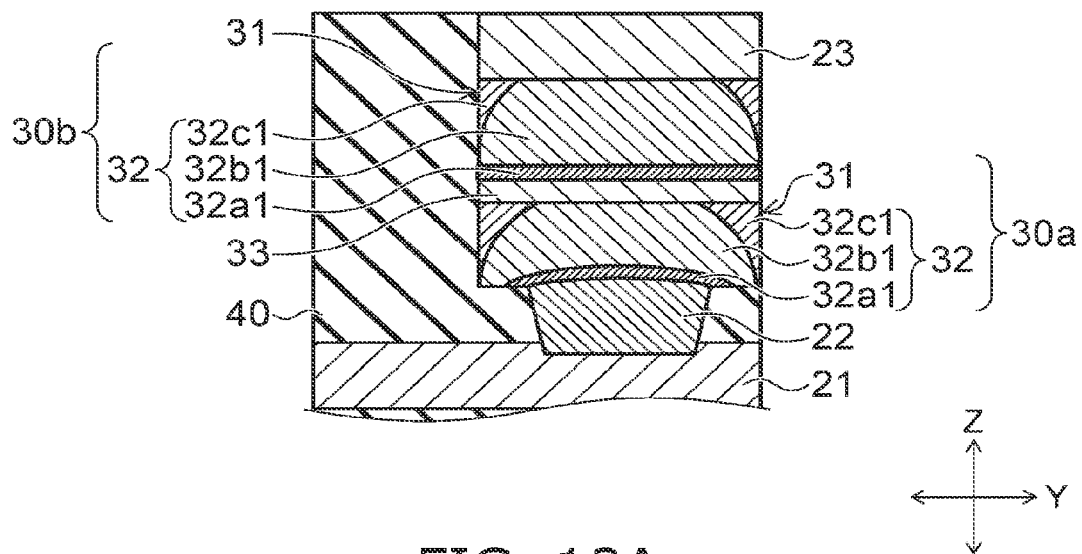
FIG. 13A and FIG. 13B are schematic cross-sectional views of a variable resistance layer of a second embodiment.
Figure 13B:
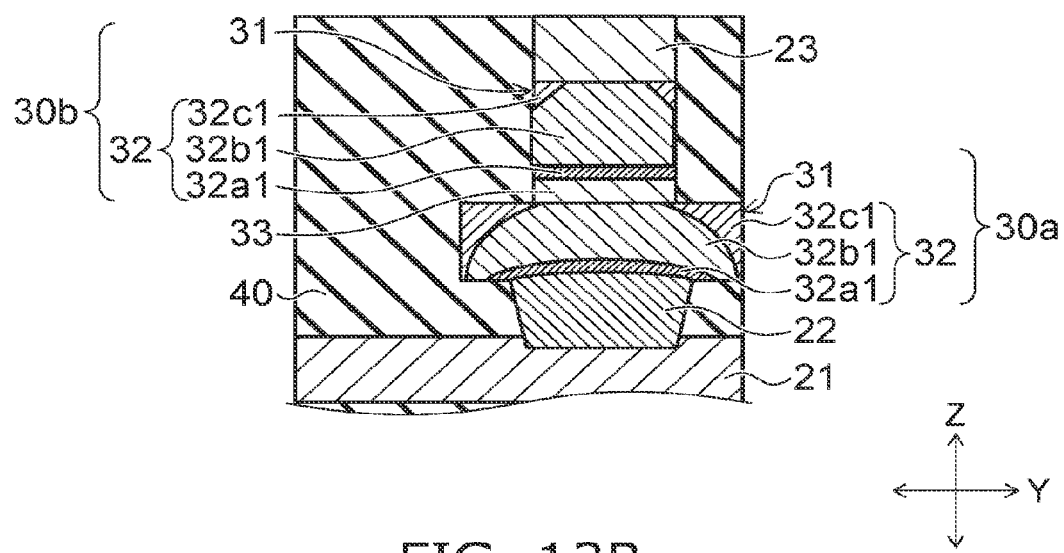

FIG. 13A and FIG. 13B are schematic cross-sectional views of the variable resistance layer 30 of a second embodiment.

The embodiment differs from the embodiment described above in that multiple variable resistance layers 30a and 30b are provided. A description is omitted for the states of the variable resistance layer 30 and the structures of the variable resistance layer 30 that are similar to those of the embodiment described above.

As shown in FIG. 13A, the variable resistance layer 30b is provided, with a metal layer 33 interposed, on the variable resistance layer 30a provided on the first electrode 22. Although there are two variable resistance layers in the embodiment, the number of variable resistance layers is arbitrary.

Similarly to the embodiment described above, the variable resistance layers 30a and 30b include the chalcogenide compound 31 and the chemical element 35. For example, the amount of the chemical element 35 included in the variable resistance layer 30a is different from the amount of the chemical element 35 included in the variable resistance layer 30b. The metal layer 33 includes, for example, a material that is different from the electrode (one of the first electrode 22 or the second electrode 23).

As shown in FIG. 13B, for example, when viewed from the Z-direction, the surface area of the variable resistance layer 30a is greater than the surface area of the variable resistance layer 30b and greater than the surface area of the metal layer 33.

According to the embodiment, similarly to the embodiment described above, the variable resistance layer 30 has the first state F1 and the second state F2 that have different concentration distributions of the chemical element 35. Thereby, effects similar to those of the embodiment described above are obtained; and, for example, it is possible to control the states using a low voltage.

In addition to the description recited above, the amount of the chemical element 35 included inside the variable resistance layer 30a is different from the amount of the chemical element 35 included inside the variable resistance layer 30b. Thereby, mutually-different states can be formed when the same voltage is applied to the variable resistance layers 30a and 30b. In other words, multi-level memory that uses the variable resistance layers 30a and 30b is possible.

For example, there are four types of combinations of the multi-level memory of the variable resistance layers 30a and 30b, i.e., both the variable resistance layers 30a and 30b being in the first state F1, the variable resistance layer 30a being in the first state F1 and the variable resistance layer 30b being in the second state F2, the variable resistance layer 30a being in the second state F2 and the variable resistance layer 30b being in the first state F1, and both the variable resistance layers 30a and 30b being in the second state F2.

Further, the metal layer 33 includes a material that is different from the electrodes 22 and 23. Therefore, the specific heat of the metal layer 33 is different from the specific heats of the electrodes 22 and 23. Thereby, mutually-different heat amounts are provided when the same voltage is applied to the variable resistance layers 30a and 30b. Thereby, the variable resistance layers 30a and 30b can be formed in mutually-different states. In other words, multi-level memory that uses the variable resistance layers 30a and 30b is possible.

The metal layer 33 may include the same material as the electrodes 22 and 23. In such a case, by controlling the diameter of the electrodes 22 and 23 and inside the metal layer 33, the current density of the electrodes 22 and 23 and inside the metal layer 33 are able to be controlled. Thus, each of temperature of the electrodes 22 and 23 and the metal layer 33 is able to controlled; and effects similar to the content described above are obtained.

Further, when viewed from the Z-direction, the surface area of the variable resistance layer 30a is greater than the surface area of the variable resistance layer 30b and greater than the surface area of the metal layer 33. Thereby, mutually-different heat amounts are provided when the same voltage is applied to the variable resistance layers 30a and 30b. Thereby, the variable resistance layers 30a and 30b are formed in mutually-different states. In other words, multi-level memory using the variable resistance layers 30a and 30b is possible.

When viewed from the Z-direction, the surface area of the variable resistance layer 30a may be less than the surface area of the variable resistance layer 30b and less than the surface area of the metal layer 33; and it is sufficient for the surface areas of the variable resistance layers 30a and 30b to be different. Even in such a case, effects similar to the content described above are obtained.

In the embodiment as well, the restoring operation S130 described above can be implemented on the variable resistance layers. Therefore, the fluctuation of the resistance value caused by repeatedly performing the resistance change operation can be suppressed; and it is possible to increase the number of resistance changes.

Third Embodiment

Figure 14A:
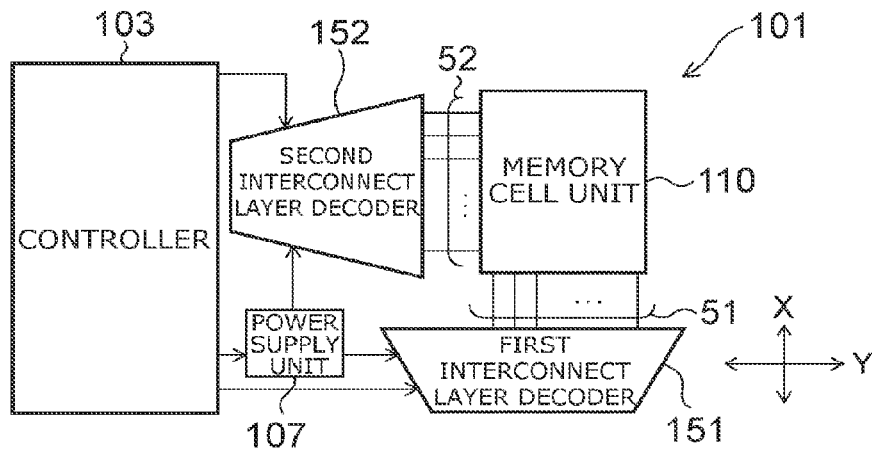
FIG. 14A is a circuit diagram of a memory device of a third embodiment.
Figure 14B:
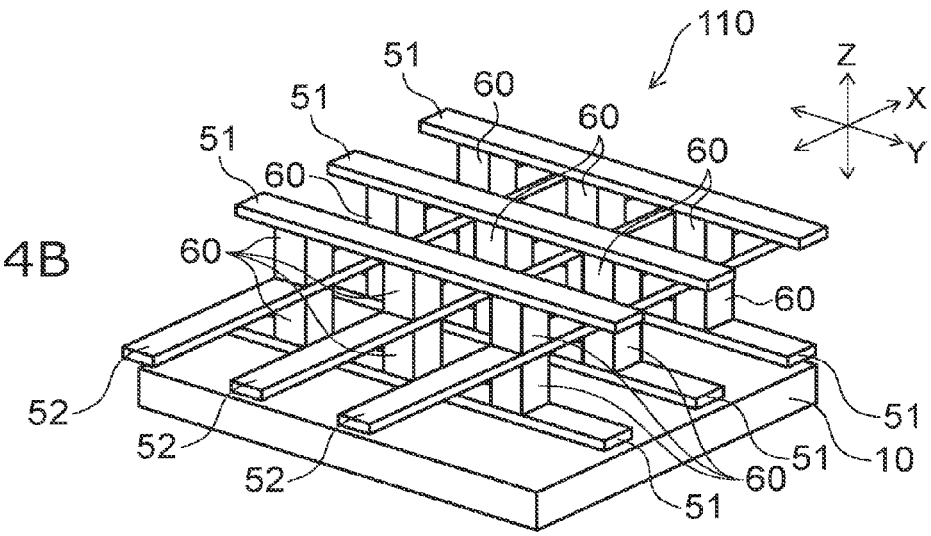
FIG. 14B is a schematic perspective view of a memory cell unit of the third embodiment.

FIG. 14A is a circuit diagram of a memory device 101 of a third embodiment; and FIG. 14B is a schematic perspective view of a memory cell unit 110 of the third embodiment. In FIG. 14B as well, some of the insulating layers, etc., are not shown for easier viewing of the drawing.

Figure 14C:
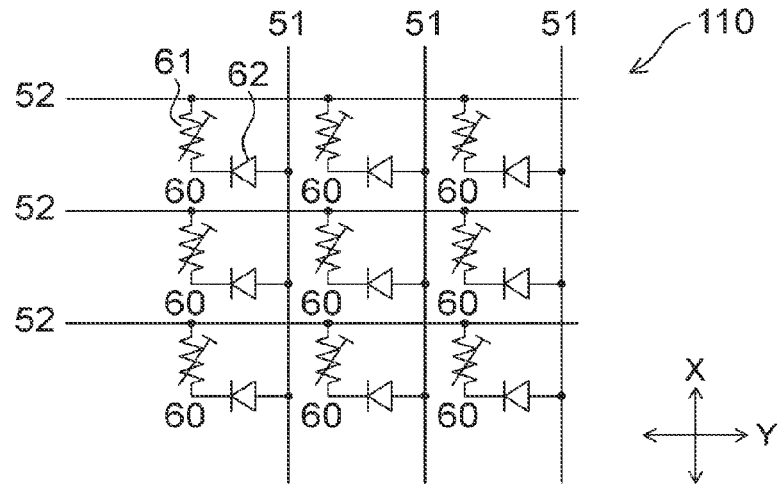
FIG. 14C is a circuit diagram of the memory cell unit of the third embodiment.

FIG. 14C is a circuit diagram of the memory cell unit 110 of the third embodiment.

The memory device 101 of the embodiment is a cross-point memory device. A description is omitted for the states of a variable resistance layer 61 and the structures of the variable resistance layer 61 that are similar to those of the embodiments described above.

As shown in FIG. 14A, the memory device 101 of the embodiment includes the memory cell unit 110, a controller 103, a first interconnect layer decoder 151, a second interconnect layer decoder 152, and a power supply unit 107. The controller 103, the first interconnect layer decoder 151, the second interconnect layer decoder 152, and the power supply unit 107 are similar to those of the embodiments described above; and a description is omitted.

As shown in FIG. 14B, the memory cell unit 110 is provided on the substrate 10 with a not-shown insulating layer interposed.

In the memory cell unit 110, multiple first interconnect layers 51 (bit lines) that extend in the X-direction (a first direction) parallel to the upper surface of the substrate 10 are provided; and multiple second interconnect layers 52 (word lines) that extend in the Y-direction (a second direction) intersecting the X-direction and parallel to the upper surface of the substrate 10 are provided. The first interconnect layers 51 and the second interconnect layers 52 are stacked alternately with insulating films interposed. Also, the first interconnect layers 51 do not contact each other; the second interconnect layers 52 do not contact each other; and the first interconnect layers 51 do not contact the second interconnect layers 52.

A pillar 60 that extends in a direction (the Z-direction) perpendicular to the upper surface of the substrate 10 is provided at the most proximal lines of the first interconnect layers 51 and the second interconnect layers 52. The pillars 60 are provided between the first interconnect layers 51 and the second interconnect layers 52.

As shown in FIG. 14B, the variable resistance layer 61 and a diode 62 are provided inside one pillar 60. In other words, the memory device 101 is a cross-point device in which the variable resistance layer 61 is provided at each most proximal point between the first interconnect layers 51 and the second interconnect layers 52.

Similarly to the variable resistance layer 30 of the embodiments described above, the variable resistance layer 61 includes the chalcogenide compound 31 and the chemical element 35.

An example of the operation method for changing the state of the variable resistance layer 61 will now be described with reference to FIG. 15A to FIG. 17. A description is omitted for the same content as the embodiments described above.

The basic operation method of the multiple variable resistance layers 61 will now be described with reference to FIG. 15A to FIG. 15E.

Figure 15A:
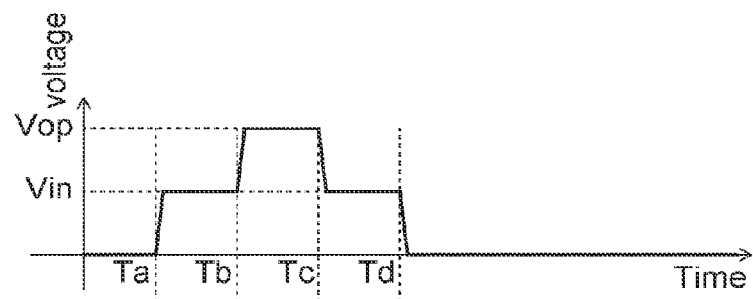
FIGS. 15A to 15D are graphs showing the relationship between time and the voltage value applied to each of the interconnect layers.
Figure 15B:
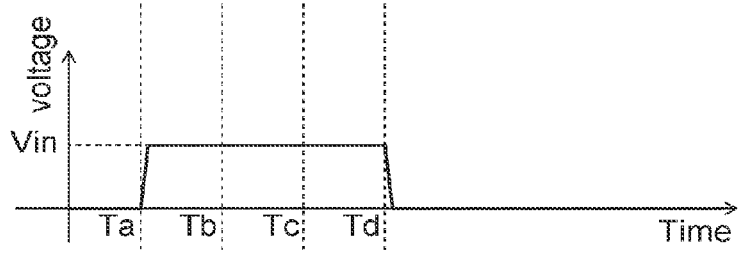
Figure 15C:
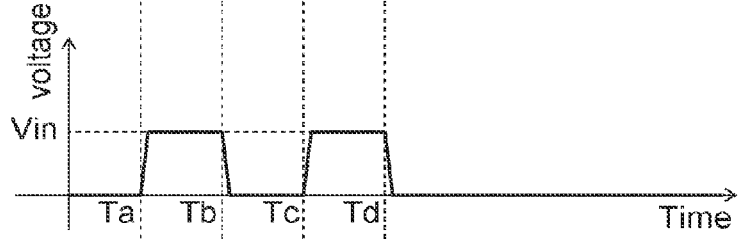
Figure 15D:
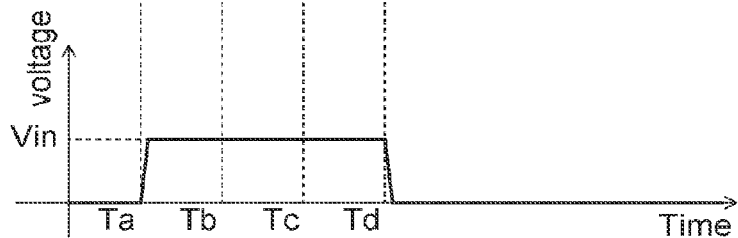
Figure 15E:
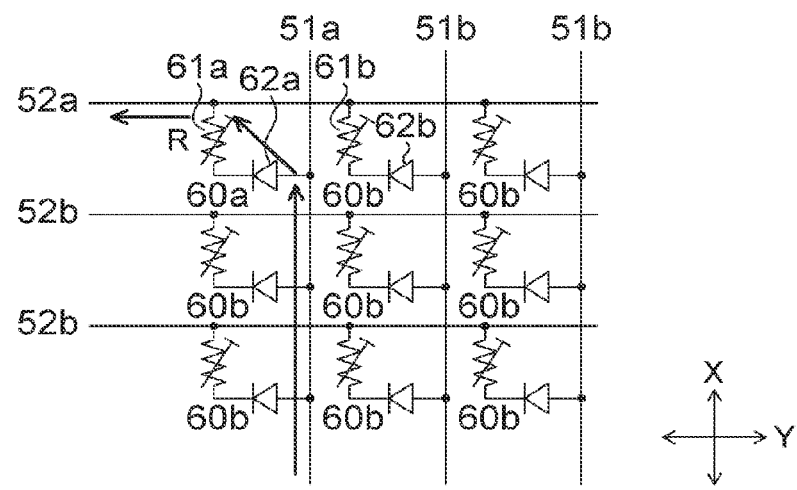
FIG. 15E is a circuit diagram of the memory cell unit of the third embodiment.

As shown in FIG. 15E, a first interconnect layer 51a and a second interconnect layer 52a are connected to a variable resistance layer 61a (a selected element) that is selected. The voltage that is applied to the variable resistance layer 61a that is selected is different from the voltage applied to variable resistance layers 61b (half-selected elements) that are not selected.

As shown in FIG. 15A, a voltage Vin is applied to the first interconnect layer 51a from a time Ta to a time Tb (pre-charge). The voltage Vin is, for example, ½Vop. Subsequently, the voltage that is applied to the first interconnect layer 51a from the time Tb to a time Tc is modified to the voltage Vop; and the voltage from the time Tc to a time Td is modified to the voltage Vin. The voltage Vop that is applied to the first interconnect layer 51a is the same as the voltage Vop used in the set operation S110 and the reset operation S150 described above.

Conversely, as shown in FIG. 15B, the voltage Vin is applied to multiple first interconnect layers 51b from the time Ta to the time Td.

As shown in FIG. 15C, the voltage Vin is applied to the second interconnect layer 52a from the time Ta to the time Tb. Subsequently, the voltage that is applied to the second interconnect layer 52a is modified to 0 V from the time Tb to the time Tc; and the voltage is modified to the voltage Vin from the time Tc to the time Td.

Conversely, as shown in FIG. 15D, the voltage Vin is applied to multiple second interconnect layers 52b from the time Ta to the time Td.

Thereby, the voltage Vop is applied to the variable resistance layer 61a that is selected; and the current illustrated by the arrow of FIG. 15E flows. The voltage Vin or the voltage of 0 V is applied to the variable resistance layers 61b that are not selected. Therefore, the resistance change operation can be performed on only the variable resistance layer 61a that is selected.

As described above, the set operation S110 and the reset operation S150 can be modified by different pulse ramp-down times and different applied voltages.

An immobilization operation S170 will now be described with reference to FIG. 16A and FIG. 16B. As shown in FIG. 3D, the immobilization operation S170 is an operation of forming the third structure C3 in the variable resistance layer 61.

Figure 16A:
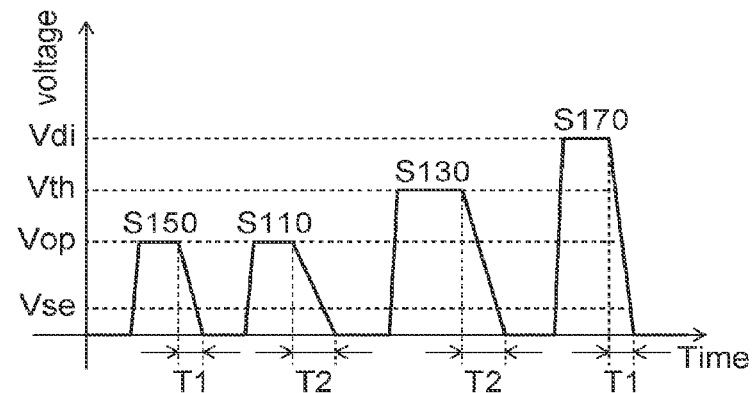
FIG. 16A and FIG. 16B are graphs showing the relationship between time and the voltage value applied to the variable resistance layer.

As shown in FIG. 16A, the immobilization operation S170 ramps-down the voltage application in the ramp-down time T1 after a voltage Vdi is applied between the first electrode 22 and the second electrode 23 from the time Tb to the time Tc shown in FIG. 15A to FIG. 15D. The voltage Vdi that is used in the immobilization operation S170 is higher than the voltage Vth used in the restoring operation S130. As shown in FIG. 16B, for example, similarly to the voltages used in each of the set operation S110, the reset operation S150, and the restoring operation S130, the voltage Vdi may be ramped-up in steps and may be ramped-down in steps. The pulse ramp-down time of the voltage Vdi is the same as the pulse ramp-down time T1 of the voltage used in the reset operation S150.

The operation method of the immobilization operation S170 will now be described with reference to FIG. 16C.

Figure 16B:
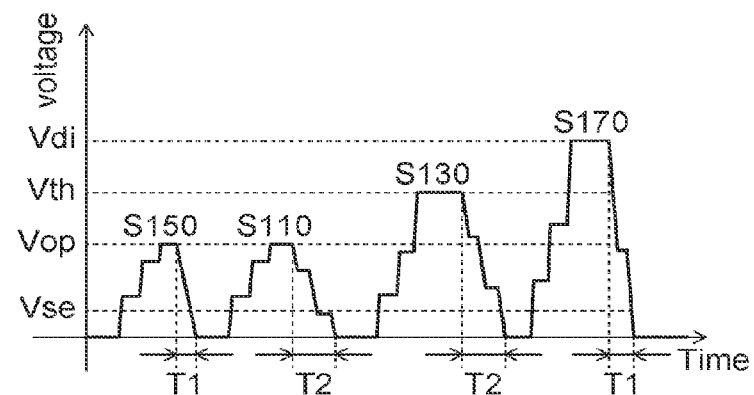
Figure 16C:
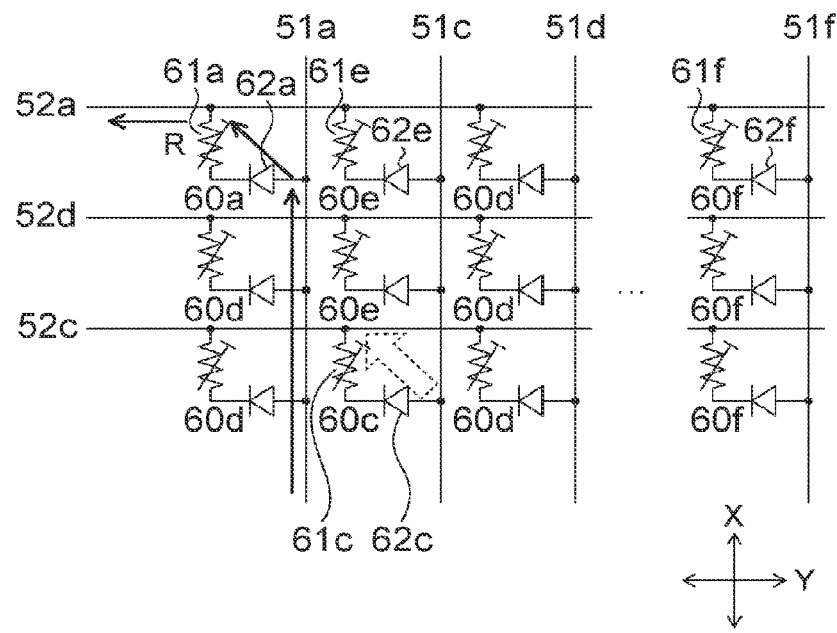
FIG. 16C is a circuit diagram of the memory cell unit of the third embodiment.

As shown in FIG. 16C, a first interconnect layer 51c and a second interconnect layer 52c are connected to a variable resistance layer 61c having the first structure C1. The voltage Vdi is applied to the first interconnect layer 51c. The relationship between time and the voltage applied to the first interconnect layer 51c is similar to the case where the voltage Vop of the graph shown in FIG. 15A is modified to the voltage Vdi.

The relationship between time and the voltage applied to the second interconnect layer 52c is similar to that of the graph shown in FIG. 15C; and, for example, the voltage Vin is ½Vdi.

The relationships between time and the voltage applied to the first interconnect layers 51a and 51d and the second interconnect layers 52a and 52d connected to the variable resistance layers 61a, 61b, and 61e that are not selected in the immobilization operation S170 are similar to those of FIG. 15B and FIG. 15D.

For example, it is also possible to copy the resistance states (the information) of the variable resistance layers 61c and 61e recited above to variable resistance layers 61f via an interconnect layer 51f of a redundant unit (a copy operation). In such a case, after copying to the variable resistance layers 61f, the immobilization operation S170 is implemented on the variable resistance layer 61c; and the resistance states copied to the variable resistance layers 61f of the redundant unit are copied to the variable resistance layers 61c and 61e. The number of variable resistance layers 61f to be copied is arbitrary. Also, the copy operation may be implemented in the restoring operation S130.

The immobilization operation S170 shown in FIG. 16A and FIG. 16B can be performed similarly for the embodiments described above.

Figure 17:
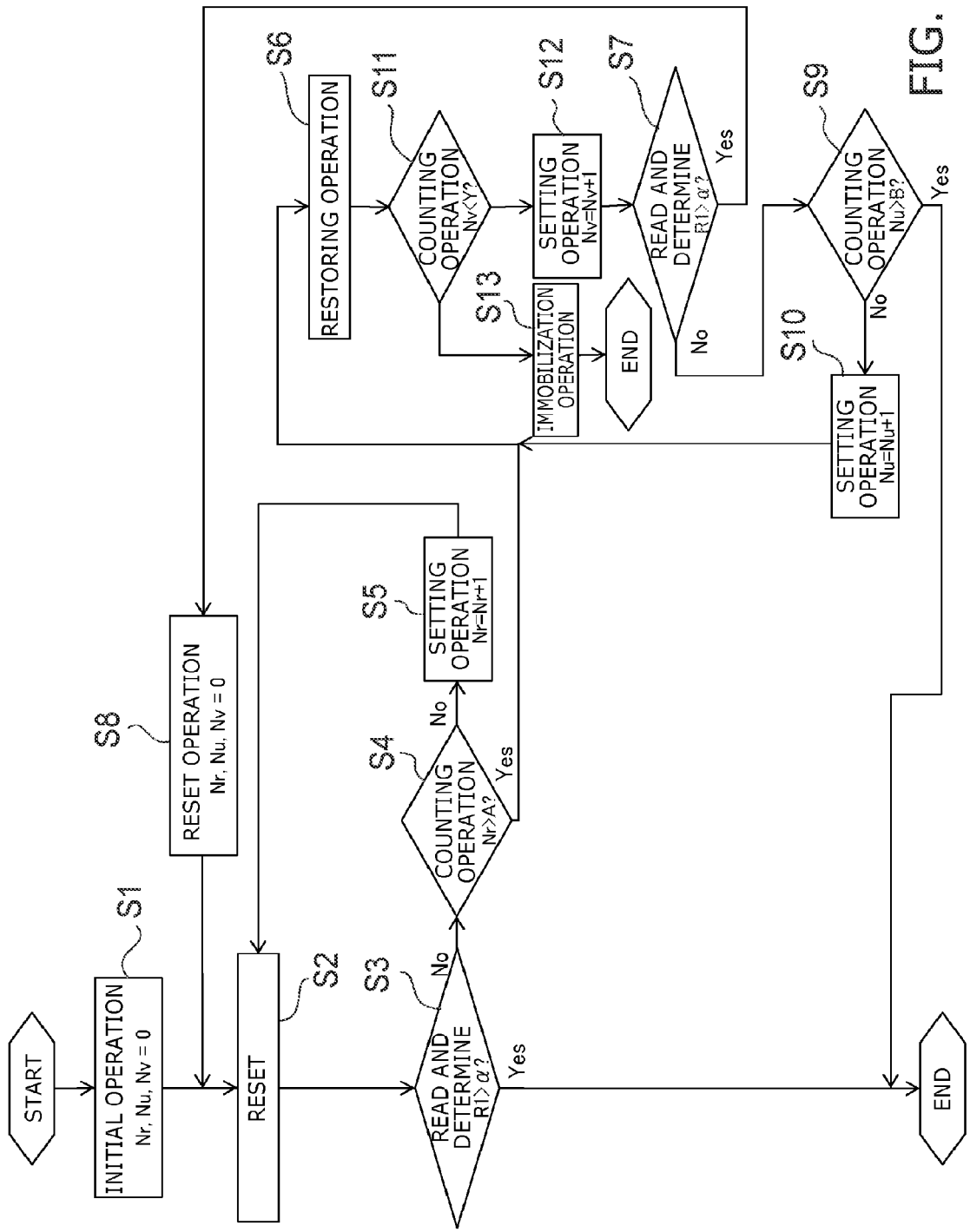
FIG. 17 is a flowchart showing an operation of the third embodiment.

The operations that are executed on the variable resistance layer 61 will now be described with reference to FIG. 17. In FIG. 17, step S11 to step S13 are added to the flowchart shown in FIG. 6. Therefore, a description is omitted for the operations other than the added operations.

A counting operation S210 is performed in step S11. In the counting operation S210 in the register 3a, it is determined whether or not a total number of implementations Nv (a second number of times) of the restoring operation S130 is smaller than a number of settings Y. If the number of implementations Nv is smaller than the number of settings Y (YES), the operation proceeds to step S12 to attempt the restoring operation S130 again. If the number of implementations Nv is not less than the number of settings Y (NO), the possibility is high that the structure of the variable resistance layer 30 will not change even when the restoring operation S130 is performed. Therefore, the operation proceeds to step S13.

In step S12, a setting operation of the restoring operation S130 is performed. In the setting operation of the restoring operation S130, the number of implementations Nv of the restoring operation S130 is set to Nv+1.

In step S13, the immobilization operation S170 is implemented (a fifth operation). In the immobilization operation S170, the voltage Vdi (a fifth voltage) is applied between the first electrode 22 and the second electrode 23.

The third structure C3 is formed in the case where the variable resistance layer 61 is restored not less than the total number of settings Y by the operation described above. Step S13 may include the operation of copying the variable resistance layers 61f described above.

Figure 18:
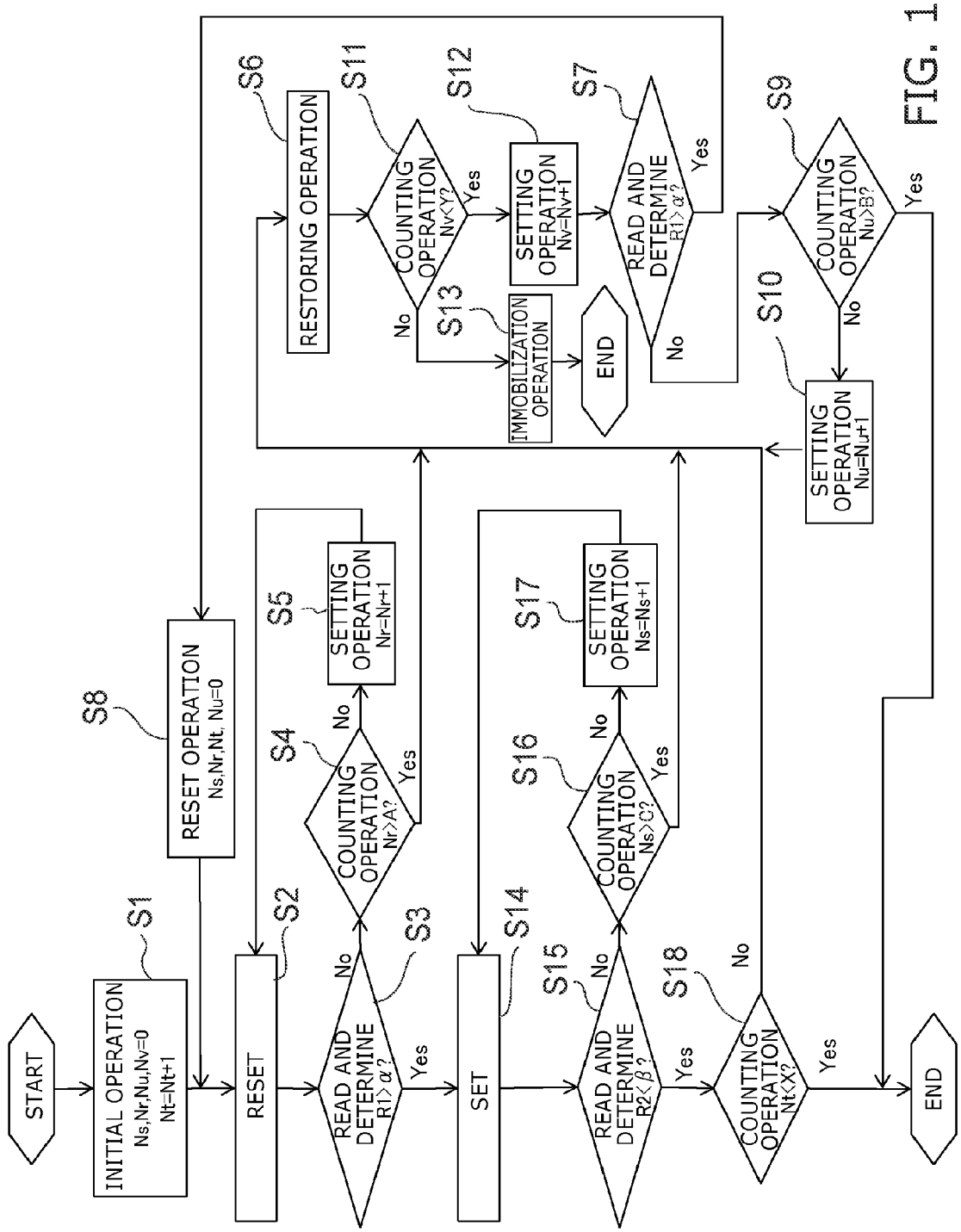
FIG. 18 is a flowchart showing an operation of the third embodiment.

Other operations executed on the variable resistance layer 61 will now be described with reference to FIG. 18. In FIG. 18, step S14 to step S18 are added to the flowchart shown in FIG. 17. Therefore, a description is omitted for the operations other than the added operations.

In step S3, if the value that is output from the variable resistance layer 30 is larger than the prescribed value α (YES), it is considered that the variable resistance layer 30 does not have the first structure C1. Therefore, the operation proceeds to step S14. Step S14 to step S17 are operations performed to determine whether or not the possibility that the variable resistance layer 30 has the first structure C1 is high; and step S18 is an operation performed to implement the restoring operation S130 regularly.

In step S14, the set operation S110 is performed (a sixth operation). In the set operation S110, the voltage Vop (a sixth voltage) is applied between the first electrode 22 and the second electrode 23.

In step S15, the read-out operation S120 and a determination are performed (a seventh operation). In the read-out operation S120, the voltage Vse is applied between the first electrode 22 and the second electrode 23. Then, it is determined whether or not the current value or the voltage value output from the read-out operation S120 is less than a prescribed value β. Here, it is taken that the resistance value is large when the current value or the voltage value is large.

If the value output from the variable resistance layer 30 is less than the prescribed value β (YES), it is considered that the variable resistance layer 30 does not have the first structure C1. Therefore, the operation proceeds to step S18. If the value that is output from the variable resistance layer 30 is not less than the prescribed value β (NO), there is a possibility that the variable resistance layer 30 has the first structure C1. Therefore, the operation proceeds to step S16.

That is, in step S15, it is determined whether or not the variable resistance layer 30 has the first structure C1. The prescribed value β is arbitrary; and the determination may be performed by setting a constant range.

A counting operation of the set operation S110 is performed in step S16. The counting operation of the set operation S110 in the register 3a determines whether or not a number of implementations Ns (a third number of times) of the set operation S110 is larger than the number of settings C. If the number of implementations Ns is larger than C (YES), there is a possibility that there is an abnormality in which the resistance of the variable resistance layer 30 does not decrease. Therefore, the operation proceeds to step S6.

If the number of implementations Ns is not more than C (NO), there is a possibility that the variable resistance layer 30 will operation normally when performing the set operation again. Therefore, the operation proceeds to step S17.

A setting operation of the set operation S110 is performed in step S17. In the setting operation of the set operation S110, the number of implementations Ns of the set operation S110 is set to Ns+1.

A counting operation S220 is performed in step S18. The counting operation S220 in the register 3a determines whether or not a total number of implementations Nt (a fourth number of times) of the set operation S110 and the reset operation S150 is smaller than a number of settings X. If the total number of implementations Nt is smaller than the number of settings X (YES), the operation ends. If the total number of implementations Nt is not less than the number of settings Y (NO), the operation proceeds to step S6 to implement the regular restoring operation S130.

Figure 19:
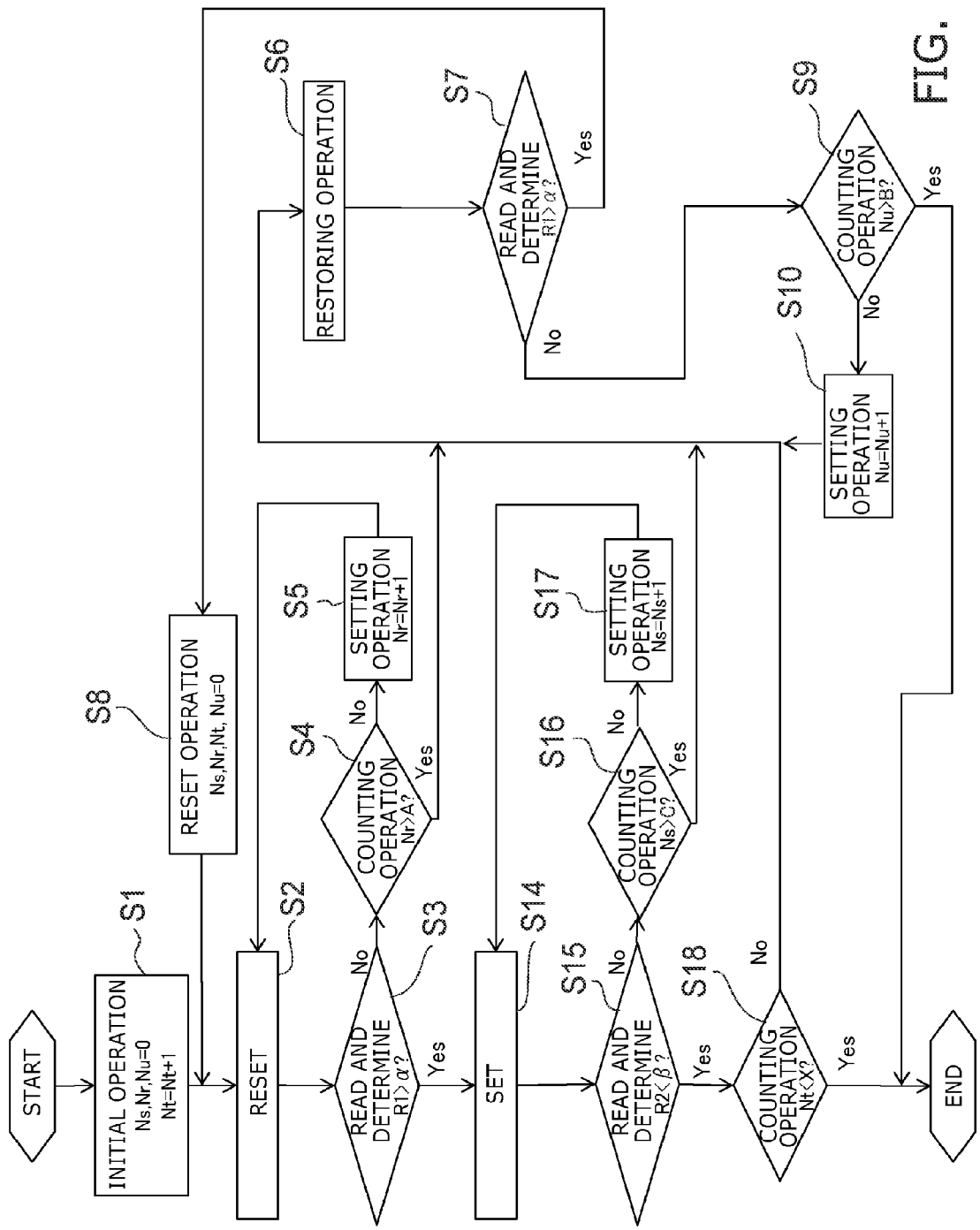
FIG. 19 is a flowchart showing an operation of the first embodiment.

Steps S15 to S18 of FIG. 18 described above may be added to the flowchart shown in FIG. 6. In such a case, the flowchart is as in FIG. 19; and a description is omitted.

Effects of the embodiment will now be described.

According to the embodiment, similarly to the embodiments described above, the restoring operation S130 is performed in addition to the resistance change operations S110 and S150 that do not melt the variable resistance layer 61. Thereby, the fluctuation of the resistance value caused by repeatedly performing the resistance change operation can be suppressed; and it is possible to increase the number of resistance changes.

Further, according to the embodiment, the immobilization operation S170 that forms the third structure C3 is performed for the variable resistance layer 61c that is no longer driven by low electrical power.

For example, the variable resistance layer 30 that has the third structure C3 has a high resistance compared to the case where the structure is not the third structure C3, regardless of whether the structure is in the state F1 or F2. The resistance of the variable resistance layer 30 having the third structure C3 substantially does not change, even when the voltage of the resistance change operation is applied.

For example, as shown in FIG. 16C, the variable resistance layer 61c that has the first structure C1 is provided. In such a case, the electrical resistance of the variable resistance layer 61c is about the same as the electrical resistance of the low resistance state regardless of the resistance change operation. Therefore, the variable resistance layer 61c becomes a leakage path (the wavy line arrow of FIG. 1C); and the power consumption of the memory cell unit 110 increases. Further, the resistance change, reading, etc., of the other variable resistance layers 61a and 61d are impeded by the leakage current via the variable resistance layer 61c.

Conversely, according to the embodiment, the variable resistance layer 61c has an electrical resistance that is about the same as the high resistance state due to the immobilization operation S170 that forms the third structure C3 shown in FIG. 3D. Therefore, the current (the leakage current) flowing in the other variable resistance layers 61a, 61b, and 61d can be suppressed.

For example, when the voltage Vdi is applied to the variable resistance layer 61c that is the object of the immobilization operation S170, the high voltage is applied also to the variable resistance layers 61e connected to the same first interconnect layer 51c as the variable resistance layer 61c; and the resistance may be changed.

Conversely, according to the embodiment, it is possible to copy the information of the variable resistance layers 61e to the variable resistance layers 61f of the redundant unit. Thereby, the immobilization operation S170 of the variable resistance layer 61c can be performed without changing the resistance of the variable resistance layers 61e. Therefore, it is possible to further increase the number of resistance changes of the entire memory cell unit 110.

According to the embodiment, similarly to the embodiments described above, the variable resistance layer 61 has the first state F1 and the second state F2 which have different concentrations of the chemical element 35. Thereby, effects similar to those of the embodiments described above are obtained; and, for example, it is possible to control the states using a low voltage.

In addition to the description recited above, according to the third operation method of the embodiments described above, the reset operation S150 applies the negative voltage −Vt; and the set operation S110 applies the positive voltage Vt.

For example, in the reset operation S150, when the positive voltage Vt is applied similarly to the set operation S110, there is a possibility that misoperations of the variable resistance layers 61b (the half-selected elements) other than the selected variable resistance layer 61a may occur.

Therefore, in the reset operation S150, it is possible to prevent the misoperations of the half-selected elements by applying the negative voltage −Vt that is different from that of the set operation S110.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A memory device, comprising:
a controller;
a first electrode and a second electrode connected to the controller; and
a variable resistance layer provided between the first electrode and the second electrode, the variable resistance layer including a chalcogenide compound including a grain boundary,
the variable resistance layer having
a first structure, and
a second structure, a structure of the grain boundary of the second structure being different from a structure of the grain boundary of the first structure,
the controller configured to be able to perform
a first operation of applying a first voltage between the first electrode and the second electrode,
a second operation of applying a second voltage between the first electrode and the second electrode and determining whether or not the variable resistance layer has the first structure, the second voltage being lower than the first voltage, and
a third operation of applying a third voltage between the first electrode and the second electrode having the interposed variable resistance layer determined to have the first structure in the second operation, the third voltage being higher than the first voltage and the second voltage,
wherein the controller is configured to be able to perform the third operation after the first operation is performed a first number of times,
a fourth operation of applying a fourth voltage between the first electrode and the second electrode having the interposed variable resistance layer after the third operation is Performed a second number of times, the fourth voltage being higher than the third voltage, a fifth operation of applying a fifth voltage between the first electrode and the second electrode having the interposed variable resistance layer determined to not have the first structure in the second operation, the fifth voltage being higher than the second voltage and lower than the third voltage, a sixth operation of applying a sixth voltage between the first electrode and the second electrode and determining whether or not the variable resistance layer has the first structure, the sixth voltage being lower than the first voltage, the third operation after the fifth operation is performed a third number of times, and the third operation after the first operation and the fifth operation are performed a fourth number of times.

2. The memory device according to claim 1, wherein the controller is configured to be able to perform a seventh operation of applying a seventh voltage between the first electrode and the second electrode having the interposed variable resistance layer having undergone the third operation and determining whether or not the variable resistance layer has the first structure, the seventh voltage being lower than the first voltage.

3. The memory device according to claim 1, wherein
the first voltage is lower than a voltage changing the structure of the grain boundary of the variable resistance layer,
the third voltage is higher than a voltage changing the structure of the grain boundary of the variable resistance layer, and
the first structure is changed to the second structure by implementing the third operation on the variable resistance layer.

4. The memory device according to claim 1, wherein a density of the grain boundary of the first structure is higher than a density of the grain boundary of the second structure.

5. The memory device according to claim 1, wherein a length extending in a direction of the grain boundary of the first structure is longer than a length extending in the direction of the grain boundary of the second structure, the direction being from the first electrode toward the second electrode.

6. The memory device according to claim 1, wherein a density of a chemical element provided on the grain boundary of the first structure is higher than a density of the chemical element provided on the grain boundary of the second structure.

7. The memory device according to claim 1, wherein the variable resistance layer includes
at least one chemical element of germanium, silicon, or carbon,
a first region covering one of an upper surface of the first electrode or a lower surface of the second electrode, and
a second region, a concentration of the chemical element being lower in the second region than in the first region.

8. The memory device according to claim 7, wherein
the first structure is changed to the second structure by implementing the third operation on the variable resistance layer, and
a portion of the grain boundary of the first structure and the first region of the first structure overlapping is larger than a portion of the grain boundary of the second structure and the first region of the first structure overlapping.

9. The memory device according to claim 1, wherein
the variable resistance layer having undergone the fourth operation has a third structure, and
a resistance of the variable resistance layer having the third structure is higher than a resistance of the variable resistance layer having the first structure.

10. The memory device according to claim 1, wherein a ramp-down time of the first voltage is shorter than a ramp-down time of the fifth voltage.

11. The memory device according to claim 1, wherein the first voltage is lower than the fifth voltage.

12. The memory device according to claim 1, wherein
the first voltage is a negative voltage, and
the fifth voltage is a positive voltage.

13. The memory device according to claim 1, wherein
the first electrode includes a plurality of first interconnects extending in a first direction, the plurality of first interconnects being connected to the controller,
the second electrode includes a plurality of second interconnects extending in a second direction intersecting the first direction, the plurality of second interconnects being connected to the controller,
the variable resistance layer includes a plurality of cells provided between each of the plurality of first interconnects and each of the plurality of second interconnects, the plurality of cells including a chalcogenide compound, and
the plurality of cells includes the first structure and the second structure.

14. The memory device according to claim 1, wherein the controller is configured to be able to perform
an eighth operation of applying an eighth voltage between the first electrode and the second electrode having the interposed variable resistance layer determined to not have the first structure in the second operation, the eighth voltage being higher than the second voltage and lower than the third voltage,
a ninth operation of applying a ninth voltage between the first electrode and the second electrode and determining whether or not the variable resistance layer has the first structure, the ninth voltage being lower than the first voltage,
the third operation after the eighth operation is performed a fifth number of times, and
the third operation after the first operation and the eighth operation is performed a sixth number of times.

15. A memory device, comprising:
a first cell; a second cell; and a third cell,
the first cell, the second cell, and the third cell including
a first electrode,
a variable resistance layer provided on the first electrode, the variable resistance layer including a chalcogenide compound including a grain boundary, and
a second electrode provided on the variable resistance layer,
a density of the grain boundary of the second cell being lower than a density of the grain boundary of the first cell,
a length extending in a first direction of the grain boundary of the second cell is shorter than a length extending in the first direction of the grain boundary of the first cell, the first direction being from the first electrode toward the second electrode,
a resistance of the third cell being higher than a resistance of the first cell, and
a density of the grain boundary of the third cell being lower than the density of the grain boundary of the first cell.

16. The memory device according to claim 15, wherein
the variable resistance layer includes a chemical element
   included inside a crystal structure of the variable resistance layer, and
a density of a plurality of chemical elements provided on the grain boundary of the second cell is lower than a density of the plurality of chemical elements provided on the grain boundary of the first cell.

\* \* \* \* \*